(12) United States Patent
Tamamori et al.

(10) Patent No.: US 11,465,418 B2
(45) Date of Patent: Oct. 11, 2022

(54) MANUFACTURING METHOD FOR STRUCTURE AND MANUFACTURING METHOD FOR LIQUID EJECTION HEAD

(71) Applicant: CANON KABUSHIKI KAISHA, Tokyo (JP)

(72) Inventors: Kenji Tamamori, Kanagawa (JP); Kazuhiro Asai, Kanagawa (JP); Tetsushi Ishikawa, Tokyo (JP); Seiichiro Yaginuma, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/204,554

(22) Filed: Mar. 17, 2021

(65) Prior Publication Data
US 2021/0300042 A1  Sep. 30, 2021

(30) Foreign Application Priority Data

Mar. 25, 2020  (JP) .............................. JP2020-054241

(51) Int. Cl.
*B41J 2/16* (2006.01)
*G03F 7/20* (2006.01)

(52) U.S. Cl.
CPC .............. *B41J 2/1631* (2013.01); *B41J 2/162* (2013.01); *G03F 7/70058* (2013.01)

(58) Field of Classification Search
CPC ........ B41J 2/1631; B41J 2/162; B41J 2/1603; B41J 2/1623; B41J 2/1628; B41J 2/1629; B41J 2/1632; B41J 2/1634; B41J 2/1635; B41J 2/1639; B41J 2/1645; G03F 7/70058; G03F 7/095; G03F 7/2022
See application file for complete search history.

(56) References Cited

U.S. PATENT DOCUMENTS

| 6,451,505 B1 * | 9/2002 | Patel ..................... B41C 1/1033 |
| | | 430/944 |
| 8,043,794 B2 * | 10/2011 | Noelscher ............. G03F 7/0035 |
| | | 430/311 |
| 8,728,713 B2 * | 5/2014 | Fabinski ............. G03F 7/70466 |
| | | 430/394 |
| 9,205,650 B2 * | 12/2015 | Yaginuma .............. B41J 2/1603 |

FOREIGN PATENT DOCUMENTS

| JP | 2017202616 A | 11/2017 |
| WO | 2013-051516 A | 4/2013 |

\* cited by examiner

*Primary Examiner* — Hung V Nguyen
(74) *Attorney, Agent, or Firm* — Canon U.S.A., Inc., IP Division

(57) ABSTRACT

A manufacturing method for a structure includes preparing a dry film supported on one surface of a support; bonding the dry film to a substrate so that the dry film and the substrate are in contact with each other; performing first exposure of the dry film bonded to the substrate via the support; removing the support after the first exposure; performing second exposure of the dry film after the support is removed via a photomask; and developing the dry film after the first exposure and the second exposure.

13 Claims, 9 Drawing Sheets

MANUFACTURING METHOD FOR STRUCTURE AND MANUFACTURING METHOD FOR LIQUID EJECTION HEAD

BACKGROUND OF THE INVENTION

Field of the Invention

The present disclosure relates to a manufacturing method for a structure for forming a structure having a photosensitive resin on a substrate and a manufacturing method for a liquid ejection head using the manufacturing method for the structure.

Description of the Related Art

A manufacturing method for forming a structure by using a substrate and a photosensitive layer made of a photosensitive resin such as a photoresist and a dry film is known. For example, the manufacturing method is used for manufacturing a liquid ejection head such as an ink jet recording head. In a manufacturing method for a structure, for example, a photosensitive layer may be formed on the support, the photosensitive layer may be laminated on a substrate and only the support may be peeled off to transfer the photosensitive layer onto the substrate. In a case where the photosensitive layer is thin and uncured, the photosensitive layer may be damaged when the support is peeled off. Japanese Patent Application Laid-Open No. 2017-202616 discloses a method in which a photoresist layer is formed on a base film which is a support, the substrate and the photoresist layer are laminated so as to be in contact with each other and the photoresist layer is subjected to pattern exposure via the support to be cured.

In the method described in Japanese Patent Application Laid-Open No. 2017-202616, since the pattern exposure of the photoresist layer is performed via the support, in a case where a foreign matter is present on the support, a pattern defect may occur.

SUMMARY OF THE INVENTION

A manufacturing method for a structure of the present disclosure includes preparing a first photosensitive layer on one surface of a first support; bonding the first photosensitive layer and one surface of a substrate so that the first photosensitive layer and the substrate are in contact with each other; performing first exposure of the first photosensitive layer bonded to the substrate via the first support; removing the first support after the first exposure; performing second exposure of the first photosensitive layer after the first support is removed via a photomask; and developing the first photosensitive layer after the first exposure and the second exposure.

Further features of the present disclosure will become apparent from the following description of exemplary embodiments with reference to the attached drawings.

DESCRIPTION OF THE EMBODIMENTS

Figure 1A:
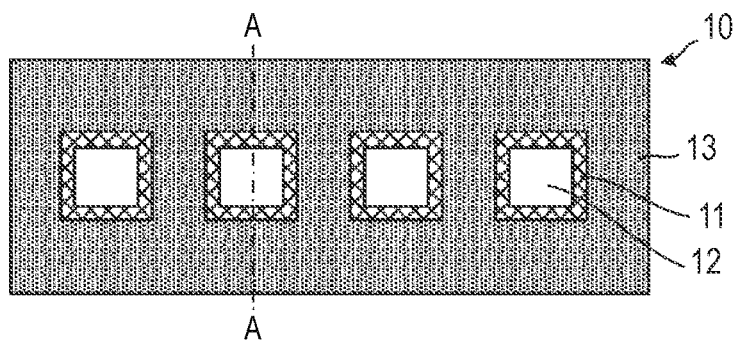
FIG. 1A is a diagram illustrating a manufacturing method for a structure according to a first embodiment.

An aspect of the present disclosure is to provide a manufacturing method for a structure having a step of exposing a photosensitive layer via a support and capable of suppressing occurrence of a pattern defect and a manufacturing method of a liquid ejection head to which this manufacturing method is applied.

Next, an exemplary embodiment of the present disclosure will be described with reference to the drawings. Each embodiment described below is subject to various technically exemplary limitations. However, the present invention is not limited to the embodiments, manufacturing examples and other specific methods described in the present specification as long as these conform to the technical idea of the present disclosure. In the following description, the same reference numerals are given to the configurations having the same function in the drawings and the description of the overlapping portion may be omitted.

First Embodiment

Figure 1B:
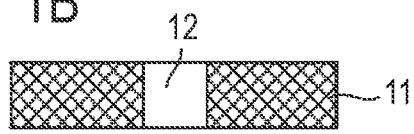
FIG. 1B is a diagram illustrating a manufacturing method for the structure according to the first embodiment.
Figure 1C:
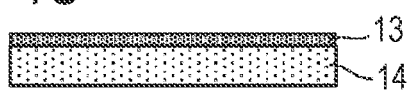
FIG. 1C is a diagram illustrating a manufacturing method for the structure according to the first embodiment.
Figure 1D:
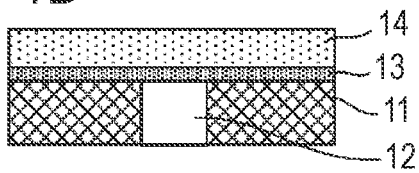
FIG. 1D is a diagram illustrating a manufacturing method for the structure according to the first embodiment.
Figure 1E:
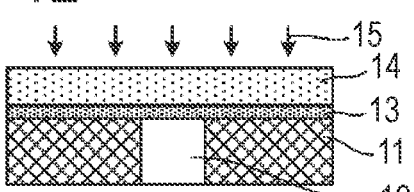
FIG. 1E is a diagram illustrating a manufacturing method for the structure according to the first embodiment.
Figure 1F:
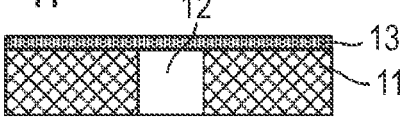
FIG. 1F is a diagram illustrating a manufacturing method for the structure according to the first embodiment.
Figure 1G:
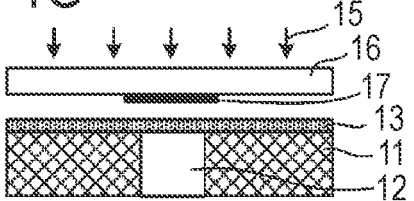
FIG. 1G is a diagram illustrating a manufacturing method for the structure according to the first embodiment.
Figure 1H:
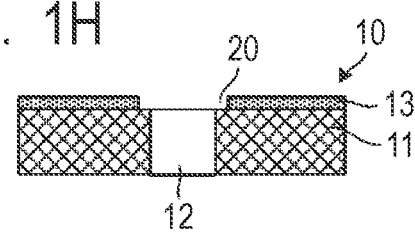
FIG. 1H is a diagram illustrating a manufacturing method for the structure according to the first embodiment.

FIGS. 1A to 1H are diagrams illustrating a manufacturing method for a structure according to a first embodiment and FIG. 1A is a plan view of a structure 10. FIGS. 1B to 1H are cross-sectional views taken along line A-A of FIG. 1A and illustrate a manufacturing process in the present embodiment step by step. In particular, FIG. 1H illustrates a cross section of the finally formed structure 10. FIGS. 1I to 1L illustrate a manufacturing process step by step in a case where a foreign matter 18 is present on a support 14 described later. In the present embodiment, a pattern made of a photosensitive resin is formed on one surface of a substrate 11 on which an opening 12 is formed to form the structure 10. In the structure 10, as illustrated in FIGS. 1A and 1H, the photosensitive resin is patterned so as to surround the opening 12 at a position where the opening 12 is provided on the substrate 11 and to form an opening 20 larger than the opening 12. At the opening 20, the surface of the substrate 11 is exposed. The opening 12 is formed as, for example, a through-hole penetrating the substrate 11.

FIG. 1B illustrates a cross section of the substrate 11. For example, the substrate 11 can be made of one of single crystal silicon, glass and ceramic. A planar shape of the opening 12 may be, for example, one of a circle and a quadrangle. In the drawing, the planar shape of the opening 12 is substantially square. The angle formed by a side wall of the opening 12 and the surface of the substrate 11 may be vertical and the opening 12 may have a tapered cross-sectional shape. A protective film (not illustrated) may be formed on one of both surfaces of the substrate 11 and on the side wall of the opening 12. The present invention is not limited to the shape of the opening 12 formed in the substrate 11.

As illustrated in FIG. 1C, a dry film 13 formed on the support 14 which is a first support is prepared separately from the substrate 11. The dry film 13 is a first photosensitive layer supported by one surface of the support 14 and having photosensitivity and is normally made of a photosensitive resin. As an example, the dry film 13 is made of, for example, a negative photosensitive resin. The dry film 13 as a negative photosensitive resin is desirably made of a negative photosensitive resin composition containing, for example, one of an epoxy resin, an acrylic resin and a urethane resin. As the epoxy resin, for example, one of bisphenol A type, cresol novolac type and alicyclic epoxy resin can be used and as the acrylic resin, for example, polymethyl methacrylate can be used. Examples of the urethane resin include various types of polyurethane. As the solvent used for the negative photosensitive resin, for example, one or more solvents selected from the group consisting of propylene glycol methyl ether acetate (PG-MEA), diglyme, cyclohexane, methyl ethyl ketone and xylene can be used. Additives may be appropriately added to this solvent, if necessary. The dry film 13 is formed on the support 14 by dissolving a negative photosensitive resin in a solvent and applying the mixture to the support 14 and removing the solvent. As a negative photosensitive resin composition, for example, one of commercially available "SU-8 series" and "KMPR (registered trademark)-1000" manufactured by Nippon Kayaku Co., Ltd. and "TMMR (registered trademark) 52000" and "TMMF (registered trademark) 52000" manufactured by Tokyo Ohka Kogyo Co., Ltd. can also be used. It is also possible to use a positive photosensitive resin as described later. As the positive photosensitive resin, for example, a commercially available photosensitive resin composition such as "PMER (registered trademark)" manufactured by Tokyo Ohka Kogyo Co., Ltd. can be used. The dry film 13 on the support 14 may be formed by, for example, one of a spin coating method, a slit coating method and a spray coating method and may be subjected to the baking treatment. In the spin coating method, a thin film of the coating liquid is formed by using centrifugal force by rotating the table on which the support 14 on which the coating liquid is dropped is placed at high speed. In the slit coating method, a thin film is formed directly on a portion of the support 14 on which the thin film is formed. In the spray coating method, a thin film of the coating liquid is formed by spraying the atomized coating liquid on the support 14.

As the support 14, for example, a support made of one of a film, a glass substrate and a silicon substrate is used and in consideration of the ease of peeling off the support 14 after the dry film 13 is transferred to the substrate 11, the film can be used. Here, the reason why the dry film 13 is formed on the support 14 is that in the present embodiment, the thickness of the dry film 13 is, for example, several µm or less and it is difficult to laminate the dry film 13 alone on the surface of the substrate 11 on which the openings 12 are formed. On the other hand, since it is difficult to develop the dry film 13 with the support 14 laminated, it is necessary to remove the support 14 before a developing step. In addition, from the viewpoint of exposing the dry film 13 via the support 14, as the support 14, an optical film can be used which is unlikely to be diffusely reflected, has a high transmittance and further has a coefficient of thermal expansion of approximately $10^{-4}$ cm/cm ° C. or less. As long as it satisfies such characteristics, a normal film such as polypropylene (PP), polycarbonate (PC), polyethylene terephthalate (PET) and polyimide (PI) can be used as the support 14. More desirably, as the support 14, a film formed of a cycloolefin polymer and a cycloolefin copolymer is used. As the cycloolefin polymer film and the cycloolefin copolymer film, ZEONOA film (registered trademark) ZF14 and ZEONOA film (registered trademark) ZF16 (manufactured by Zeon Corporation), F1-film (manufactured by GUNZE LIMITED), G3-film (manufactured by Dexerials Corporation) and Apel (registered trademark) (manufactured by Mitsui Chemicals, Inc.) can be used. The thickness of the support 14 is desirably in the range of, for example, 30 to 150 µm and more desirably in the range of 50 to 100 µm. In order to facilitate peeling, a support 14 whose surface is subjected to a mold release treatment may be used. When the exposure wavelength used in a first and second exposing steps described later is an ultraviolet wavelength, the support 14 can have a light transmittance of 70% or more in the wavelength region of 248 to 436 nm.

In a case where a reduction optical system is used for exposure via the support 14, since the focus position shifts depending on the thickness and the refractive index of the support 14, it is necessary to compensate for the focus position. Here, with respect to the moving direction of the focus position, moving the focus from the support 14 to the substrate 11 is expressed as negative (minus). For example, when PET (refractive index 1.6) having a thickness of 100 µm is used for the support 14, the surface of the support 14 may be set to 0 µm and the focus position may be shifted to the side of the substrate 11 by approximately —65 µm. Similarly, when a cycloolefin polymer (refractive index 1.53) having a thickness of 50 µm is used for the support 14, the focus position may be shifted to the side of the substrate 11 by approximately —33 µm.

Next, as illustrated in FIG. 1D, the dry film 13 is attached to the substrate 11 via the support 14 so that the dry film 13 is in contact with one surface of the substrate 11 to bond the substrate 11 and the dry film 13. The dry film 13 is transferred to and laminated on the substrate 11 via the support 14 by, for example, a laminating method while applying temperature and pressure, for example. In the implementation of the laminating method, for example, a roll-type transfer under vacuum can be performed in consideration of the discharge property of bubbles so that bubbles do not enter between the substrate 11 and the dry film 13. In order to improve the adhesion between the substrate 11 and the dry film 13, for example, a silane material treatment may be performed on the surface of the substrate 11 in advance.

Next, as illustrated in FIG. 1E, a first exposing step of exposing the dry film 13 via the support 14 is performed. The type of light 15 used for exposure is not particularly limited as long as the light can expose the dry film 13 to light and transmits the support 14 and ultraviolet rays can be used. The dry film 13 is divided into a first region, which is a region where the substrate 11 is exposed at the opening 12 and around the opening 12 (that is, region corresponding to the opening 20) by the developing step, which is a subsequent step and a second region, which is a region left on the substrate 11 in the developing step. In the first exposing step, it is necessary to irradiate with the light 15 with an exposure amount that can cure the dry film 13 in order to improve the adhesion to the substrate 11 and the first region of the dry film 13 is a portion finally removed in the developing step. Therefore, the first exposing step can be performed with an exposure amount less than the resolution limit minimum exposure amount $E_{th}$ of the dry film 13. The resolution limit minimum exposure amount is the minimum exposure amount for forming a residual film of the photosensitive resin after exposure at the resolution limit of the photosensitive resin with respect to the negative photosensitive resin. In the following description, the resolution limit minimum exposure amount is also simply referred to as the minimum exposure amount. As illustrated in FIG. 1E, the first exposing step may be full exposure without setting a light-shielding region by a photomask. When the exposure amount at this time is an exposure amount that can cure the dry film 13 and is less than the minimum exposure amount $E_{th}$, it is possible to remove the first region in the developing step while preventing the dry film 13 from peeling off from the substrate 11 when the support 14 is removed in the next step.

Next, as illustrated in FIG. 1F, the support 14 is removed from the substrate 11 by peeling the support 14 from the dry film 13. Since the dry film 13 is cured by the first exposing step and the film strength and adhesion to the substrate 11 are improved, it is possible to prevent the dry film 13 from peeling from the substrate 11 when the support 14 is removed. Here, it is more desirable that the dry film 13 is tented on the opening 12 after the support 14 is removed. However, since the first region is a region removed in a later developing step, the dry film 13 at the position of the opening 12 may remain on the side of the support 14. Before removing the support 14, the dry film 13 may be heat-treated using, for example, a hot plate.

Next, as illustrated in FIG. 1G, a second exposing step is performed. In the second exposing step, pattern exposure is performed by shielding the first region of the dry film 13 with a light-shielding portion 17 of a photomask 16 and irradiating with light 15. In a case where a photomask is used in the first exposing step, the distance between an end portion of the light-shielding portion in the first exposing step and an end portion of the light-shielding portion 16 in the second exposing step is required to be larger than the amount of deviation in alignment between these exposing steps. Specifically, the distance between the end portion of the light-shielding portion in the first exposing step and the end portion of the light-shielding portion 16 in the second exposing step is desirably, for example, 1 μm or more and more desirably 0.5 μm or more. The exposure amount in the second exposing step can be an exposure amount equal to or more than the minimum exposure amount of the dry film 13 so that the second region not shielded by the light-shielding portion 17 is left even after the developing step.

Next, the developing step is performed to remove the first region of the dry film 13. As a result, as illustrated in FIG. 1H, the structure 10 having the second region of the dry film 13 is formed on the substrate 11. As a developing solution, for example, one of PGMEA, tetrahydrofuran, cyclohexanone, methyl ethyl ketone and xylene can be used. In a case where the dry film 13 is made of a chemically amplified photosensitive resin composition, the dry film 13 may be heat-treated using a hot plate before the development of the dry film 13. In addition, the dry film 13 may be cured by performing a heat treatment after the developing step.

Figure 1I:
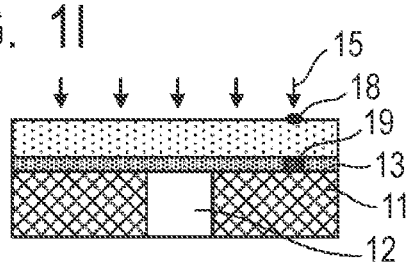
FIG. 1I is a diagram illustrating a manufacturing method for the structure according to the first embodiment.

Next, the formation of the structure 10 in a case where the foreign matter 18 is present on the support 14 in the first exposing step will be described with reference to FIGS. 1I to 1L. Examples of the foreign matter 18 include those contained in the support 14 itself, those attached to the support 14 and step particles (fine particles). Examples of the material of the foreign matter 18 include metal, silicon, inorganic material, resin and fiber waste. As illustrated in FIG. 1I, when the foreign matter 18 that does not transmit the light 15 used for exposure is present on the support 14, an unexposed portion 19 may be formed when the dry film 13 is exposed via the support 14. Therefore, in the manufacturing method for the structure in the related art, the unexposed portion 19 may cause a pattern defect after development. Specifically, in a case where the negative dry film 13 is used, the unexposed portion 19 shielded by the foreign matter 18 is removed by development, which causes a recess (hole)—shaped pattern defect. In a case where the dry film 13 is of the positive, the unexposed portion 19 shielded by the foreign matter 18 causes a pattern defect that is a development residue.

Figure 1J:
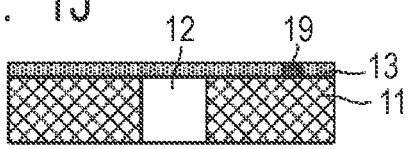
FIG. 1J is a diagram illustrating a manufacturing method for the structure according to the first embodiment.
Figure 1K:
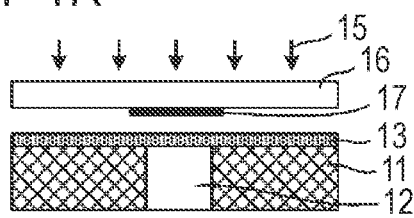
FIG. 1K is a diagram illustrating a manufacturing method for the structure according to the first embodiment.
Figure 1L:
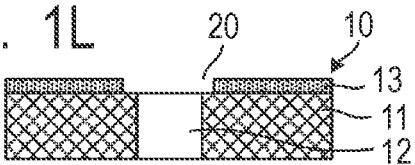
FIG. 1L is a diagram illustrating a manufacturing method for the structure according to the first embodiment.

Also in the present embodiment, in a case where the foreign matter 18 is present on the surface of the support 14, as illustrated in FIG. 1J, the unexposed portion 19 due to the foreign matter 18 is present in the second region of the dry film 13 after a first exposing step is performed at the stage where the support 14 is removed. Thereafter, as illustrated in FIG. 1K, a second exposing step is performed. At this time, by setting the exposure amount so that the second region can be left in the developing step, that is, the exposure amount equal to or more than the minimum exposure amount of the dry film 13, the unexposed portion 19 existing in the second region is eliminated. When the developing step is performed, the first region is removed and as illustrated in FIG. 1L, the structure 10 having the second region of the dry film 13 is formed on the substrate 11. In this structure 10, the pattern defect caused by the foreign matter 18 is suppressed.

According to the present embodiment, the first exposing step of exposing the dry film 13 via the support 14 which is the first support, a step of removing the support 14 and the second exposing step of exposing the dry film 13 without the support 14 are performed. By performing the first exposing step, the adhesion of the dry film 13 to the substrate 11 is increased and the dry film 13 remains on the substrate 11 side even when the support 14 is peeled off. Since pattern exposure is performed in the second exposing step without using the support 14, according to the present embodiment, even when the foreign matter 18 is present on the support 14, it is possible to suppress poor pattern formation caused by the foreign matter 18.

Second Embodiment

Figure 2A:
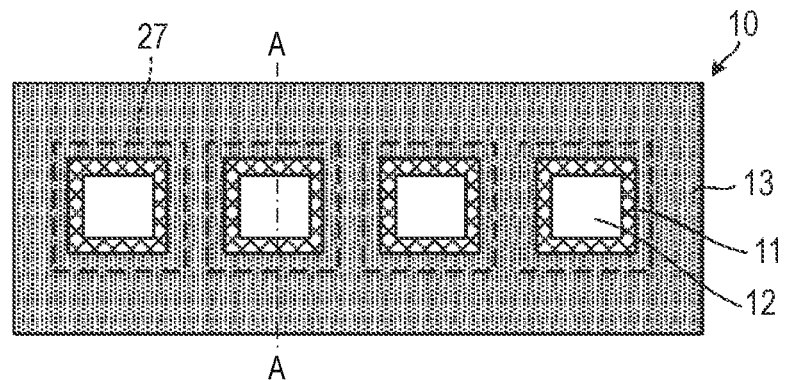
FIG. 2A is a diagram illustrating a manufacturing method for a structure according to a second embodiment.

In the manufacturing method illustrated in the first embodiment, the entire surface of the dry film 13 which is the first photosensitive layer is exposed via the support 14 which is the first support in the first exposing step. However, in the present disclosure, it is also possible to use a photomask 26 in the first exposing step to shield a predetermined region including the first region and the periphery in the dry film 13. In a second embodiment, a photomask is used in the first exposing step and the dry film 13 is exposed while shielding the first region and the peripheral region of the dry film 13 to form the same structure 10 as that formed in the first embodiment. FIGS. 2A to 2H are diagrams illustrating the manufacturing process in the second embodiment. FIG. 2A is a plan view of the structure 10 to be formed on the substrate 11 and in this drawing, the position of a light-shielding portion 27 in the photomask 26 in the first exposing step is illustrated by a broken line. FIGS. 2B to 2H are cross-sectional views taken along line A-A of FIG. 2A and illustrate a manufacturing process in the present embodiment step by step corresponding to FIGS. 1B to 1H in the first embodiment, respectively.

Figure 2B:
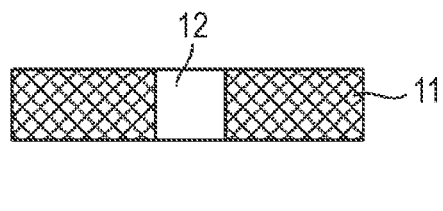
FIG. 2B is a diagram illustrating a manufacturing method for the structure according to the second embodiment.
Figure 2F:
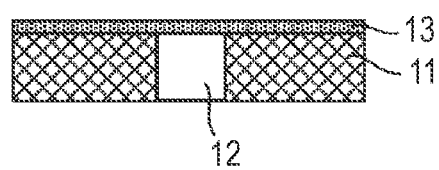
FIG. 2F is a diagram illustrating a manufacturing method for the structure according to the second embodiment.
Figure 2C:
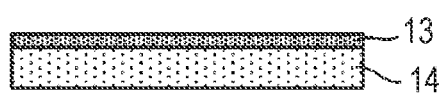
FIG. 2C is a diagram illustrating a manufacturing method for the structure according to the second embodiment.
Figure 2G:
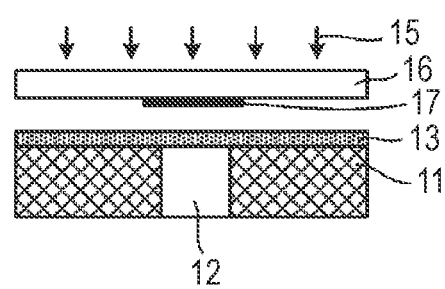
FIG. 2G is a diagram illustrating a manufacturing method for the structure according to the second embodiment.
Figure 2D:
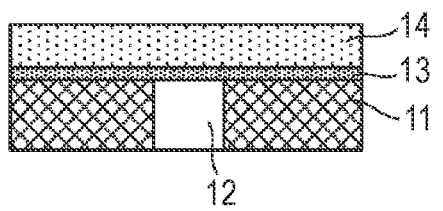
FIG. 2D is a diagram illustrating a manufacturing method for the structure according to the second embodiment.
Figure 2H:
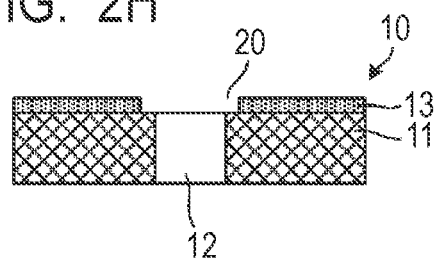
FIG. 2H is a diagram illustrating a manufacturing method for the structure according to the second embodiment.
Figure 2E:
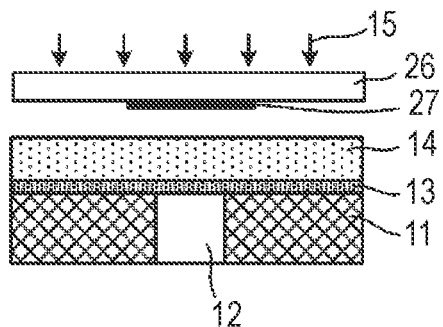
FIG. 2E is a diagram illustrating a manufacturing method for the structure according to the second embodiment.

FIG. 2B illustrates a cross section of the substrate 11 and FIG. 2C illustrates a dry film 13 formed on the support 14 prepared separately from the substrate 11. As the substrate 11, the dry film 13 and the support 14, the same ones as those described in the first embodiment are used. As illustrated in FIG. 2D, the dry film 13 is attached to and bonded to the substrate 11 via the support 14 so that the dry film 13 is in contact with one surface of the substrate 11. This bonding is also performed in the same manner as in the first embodiment. Subsequently, as illustrated in FIG. 2E, a first exposing step of exposing the dry film 13 via the support 14 is performed. The first exposing step itself is performed in the same manner as in the first embodiment and in the second embodiment, the photomask 26 is disposed between a light source and the support 14 and the light 15 for exposure from the light source is shielded by the light-shielding portion 27 formed on the photomask 26. The substrate 11 is provided with four openings 12 and for each opening 12, a region including the opening 12 and the periphery is designated as a first region in the dry film 13. The light-shielding portion 27 is formed in the photomask 26 slightly larger than the first region for each first region and a predetermined region including the first region and the periphery is not irradiated with the light 15. Also in the present embodiment, the exposure amount in the first exposing step is an exposure amount that can cure the exposed region of the dry film 13 and is less than the resolution limit minimum exposure amount $E_{th}$ of the dry film 13.

Subsequently, as illustrated in FIG. 2F, the support 14 is removed from the substrate 11 by peeling the support 14 from the dry film 13. Since the portion exposed in the first exposing step, that is, a considerable portion of the second region is cured, it is possible to remove the first region in the developing step while preventing the dry film 13 from peeling from the substrate 11 when the support 14 is removed. Thereafter, the second exposing step is performed as illustrated in FIG. 2G and further, the developing step is performed as illustrated in FIG. 2H. The second exposing step and the developing step are performed in the same manner as in the case of the first embodiment. According to the present embodiment, even when the foreign matter is present on the support 14, the second exposing step makes it possible to suppress a pattern formation defect caused by the foreign matter in the same manner as in the case of the first embodiment.

Figure 3:
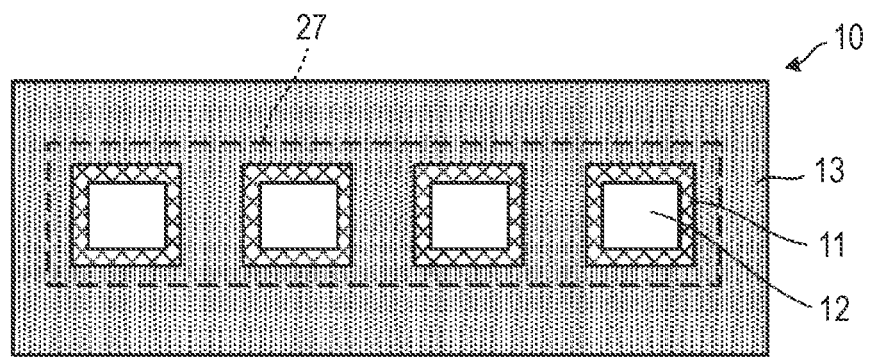
FIG. 3 is a diagram illustrating a manufacturing method for a structure in a modification example according to the second embodiment.

FIG. 3 is a diagram illustrating a manufacturing method for the structure 10 in a modification example of the second embodiment and illustrates the structure 10 formed on the substrate 11. The difference from those illustrated in FIGS. 2A to 2H is the shape of the light-shielding portion 27 formed on the photomask 26 used in the first exposing step. In those illustrated in FIGS. 2A to 2H, a total of four light-shielding portions 27 are provided for each opening 12 of the substrate 11 and in this modification example, the photomask 26 is provided with a single light-shielding portion 27 in a shape that connects a plurality of openings 12 in the substrate 11. In other words, a single predetermined region including a plurality of first regions set on the dry film 13 is shielded from light. Also in this case, when the exposure amount to the first region in the first exposing step is an exposure amount that can cure the dry film 13 and is less than the resolution limit minimum exposure amount $E_{th}$, it is possible to prevent the dry film 13 from peeling from the substrate 11 when the support 14 is removed. In addition, in this modification example, since the first exposing step only requires exposure with a rough pattern and dimension including the plurality of first regions, the degree of freedom of the process in the first exposing step can be increased.

Third Embodiment

Figure 4:
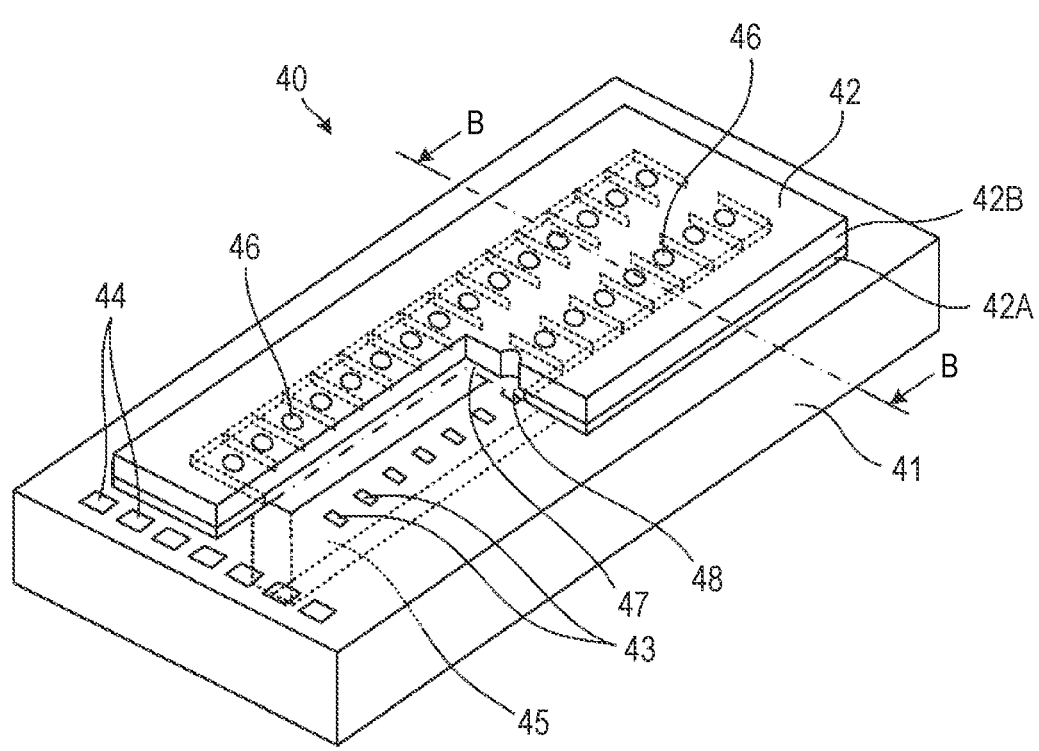
FIG. 4 is a perspective view illustrating a liquid ejection head which is an example of a structure.

Next, as a third embodiment, an example in which the manufacturing method for the structure according to the first embodiment is applied to the manufacture of a liquid ejection head will be described. The liquid ejection head is used in a liquid ejection device such as an ink jet recording device that ejects a liquid such as a recording liquid (for example, ink) to a recording medium and is a member that actually ejects the liquid from an ejection orifice in response to an applied signal. Before describing the manufacturing method for the liquid ejection head, a structure of the liquid ejection head will be described. FIG. 4 is a partially broken perspective view illustrating the configuration of a liquid ejection head 40.

The liquid ejection head 40 includes the substrate 41 and an ejection orifice forming member 42. The substrate 41 is made of, for example, single crystal silicon. Example of single crystal silicon include a silicon wafer having a crystal plane index of (100). On one surface of the substrate 41, a plurality of energy generating elements 43 for generating energy used for ejecting the liquid is formed at predetermined intervals. As the energy generating element 43, one of an electrothermal conversion element and a piezoelectric element is used. In a case where the energy generating element 43 is the electrothermal conversion element, ejection energy is generated when the energy generating element 43 heats a liquid in the vicinity thereof and causes a state change with respect to the liquid, for example, a state change from a liquid phase to a gas phase. A protective film (not illustrated) may be formed on the energy generating element 43 for protection. An electrode 44 connected to the energy generating element 43 by an electric wiring (not illustrated) is formed on one surface of the substrate 41 and the energy generating element 43 is driven by the electric power supplied from the outside of the substrate 41 via the electrodes 44. Furthermore, the substrate 41 is formed with a liquid supply path 45 used for supplying the liquid to be ejected so as to penetrate between both surfaces thereof. A protective film (not illustrated) resistant to the liquid may be formed on the surface of the substrate 41 that comes into contact with the liquid.

The ejection orifice forming member 42 is made of, for example, a material such as resin and is provided on one surface of the substrate 41 so as to form at least a flow path 47 between the ejection orifice forming member 42 and the substrate 41 in a formation region of the energy generating element 43 on the substrate 41. In the illustrated example, a pressure chamber 48 is also provided in addition to the flow path 47. An adhesion layer (not illustrated in FIG. 4) for improving these adhesions may be formed between the substrate 41 and the ejection orifice forming member 42. In addition, in the ejection orifice forming member 42, an ejection orifice 46 is formed as a through-hole for each energy generating element 43 of the substrate 41 so as to face the energy generating element 43. The pressure chamber 48 is a space formed for each energy generating element 43 so that the energy generating element 43 is disposed on the bottom surface thereof and the ejection orifice 46 is disposed on the upper surface thereof and communicates with the liquid supply path 45 via the flow path 47. The liquid supplied through the liquid supply path 45 is supplied to the pressure chamber 48 via the flow path 47 and is ejected from the ejection orifice 46 by the energy generated by driving the energy generating element 43. In the configuration in which the pressure chamber 48 is not provided, the energy generating element 43 is provided on the bottom surface of the flow path 47. In the present embodiment, the ejection orifice forming member 42 has a configuration in which a first layer 42A forming a side wall portion of the flow path 47 and the pressure chamber 48 and a plate-shaped second layer 42B on which the ejection orifice 46 is formed are laminated.

FIGS. 5A to 5L are cross-sectional views taken along line B-B of FIG. 4 and illustrate a manufacturing process of the liquid ejection head 40 illustrated in FIG. 4 step by step. As described above and as illustrated in FIG. 5A, the liquid supply path 45 is formed on the substrate 41 and the energy generating element 43 is formed in advance on one surface of the substrate 41. Examples of the forming method for the liquid supply path 45 include dry etching such as reactive ion etching, laser ablation and processing by sandblasting. In a case where the substrate 41 is made of single crystal silicon, the liquid supply path 45 can be formed by wet etching using one of an aqueous solution of tetramethylammonium hydroxide (TMAH) and an aqueous solution of potassium hydroxide (KOH). The planar shape of the liquid supply path 45 is, for example, one of a circle and a quadrangular shape. In the example illustrated in FIG. 4, the liquid supply path 45 has an elongated rectangular planar shape. The angle formed by the side wall of the liquid supply path 45 and one surface of the substrate 41 may be vertical and the liquid supply path 45 may have a tapered cross-sectional shape. A protective film (not illustrated) may be formed on one of each surface of the substrate 41 and the side wall of the liquid supply path 45. The present invention is not limited to the forming method and shape of the liquid supply path 45.

Figure 5A:
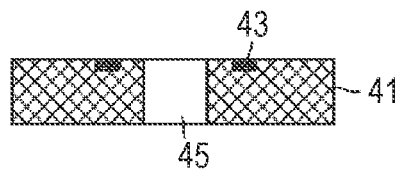
FIG. 5A is a diagram illustrating a manufacturing method for a liquid ejection head according to a third embodiment.
Figure 5B:
FIG. 5B is a diagram illustrating a manufacturing method for the liquid ejection head according to the third embodiment.

As illustrated in FIG. 5B, a dry film 54 formed on a support 55, which is a first support, is prepared separately from the substrate 41. The dry film 54, which is a first photosensitive layer, serves as an adhesion layer for improving the adhesion between the substrate 41 and the ejection orifice forming member 42 in the liquid ejection head 40. The dry film 54 is, for example, a negative photosensitive resin and can be made of the material described with reference to FIG. 1C in the first embodiment as an example. The thickness of the dry film 54 is, for example, in the range of 0.5 to 3 µm. As the support 55, for example, a support made of one of a film, a glass substrate and a silicon substrate is used and in consideration of the ease of peeling off the support 55 after the dry film 54 is transferred to the substrate 41, a film can be used. As an example, the material described with reference to FIG. 1C in the first embodiment can be used for the support 55.

Figure 5C:
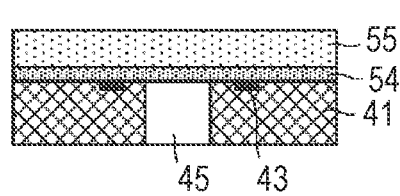
FIG. 5C is a diagram illustrating a manufacturing method for the liquid ejection head according to the third embodiment.

Next, as illustrated in FIG. 5C, the dry film 54 is attached to and bonded to the substrate 41 via the support 55 so that the dry film 54 is in contact with one surface of the substrate 41. The dry film 54 is transferred and laminated on the substrate 41 by a laminating method while, for example, temperature and pressure are applied via the support 55. In the implementation of the laminating method, for example, a roll-type transfer under vacuum can be performed in consideration of the discharge property of bubbles so that bubbles do not enter between the substrate 41 and the dry film 54. In order to improve the adhesion between the substrate 41 and the dry film 54, one surface of the substrate 41 may be treated with a silane material in advance.

Figure 5D:
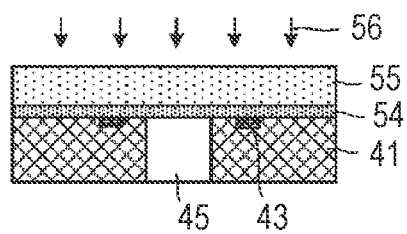
FIG. 5D is a diagram illustrating a manufacturing method for the liquid ejection head according to the third embodiment.

Next, as illustrated in FIG. 5D, a first exposing step of exposing the dry film 54 via the support 55 is performed. The type of light 56 used for exposure is not particularly limited as long as the light can expose the dry film 54 and transmits through the support 55 and ultraviolet rays can be used. The dry film 54 is divided into a first region in which the substrate 41 is exposed at the liquid supply path 45 and around the liquid supply path 45 by the developing step illustrated in FIG. 5G and a second region, which is a region left on the substrate 41 in the developing step. In the first exposing step, it is necessary to expose the dry film 54 with an exposure amount that can cure the dry film 54 in order to improve the adhesion to the substrate 41 and the first region of the dry film 54 is a portion finally removed by development. Therefore, in a case where the first exposing step is performed by full exposure, the exposure amount can be less than the resolution limit minimum exposure amount $E_{th}$ of the dry film 54. The first exposing step may be performed by full exposure and may be performed by exposure in which a predetermined region including the first region is shielded by a photomask as in the second embodiment described above. Furthermore, the first exposing step may be performed by exposure in which a predetermined region including a plurality of first regions is shielded by a photomask having a single light-shielding portion, as in the modification example of the second embodiment.

Figure 5E:
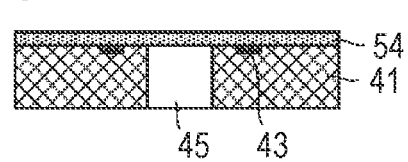
FIG. 5E is a diagram illustrating a manufacturing method for the liquid ejection head according to the third embodiment.

Next, as illustrated in FIG. 5E, the support 55 is removed from the substrate 41 by peeling the support 55 from the dry film 54. Since the dry film 54 is cured by the first exposing step and the adhesion to the substrate 41 is improved, it is possible to prevent the dry film 54 from peeling off from the substrate 41 when the support 55 is removed. It is more desirable that the dry film 54 is tented on the liquid supply path 45 after the support 55 is removed. However, since the first region is a region removed in a later developing step, the dry film 54 at the position of the liquid supply path 45 may remain on the side of the support 55. Before removing the support 55, the dry film 54 may be heat-treated using, for example, a hot plate.

Figure 5F:
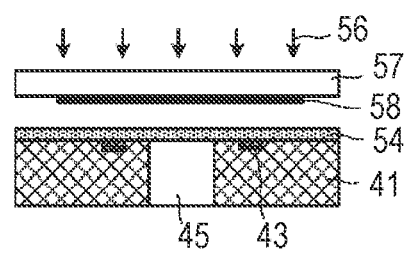
FIG. 5F is a diagram illustrating a manufacturing method for the liquid ejection head according to the third embodiment.

Next, as illustrated in FIG. 5F, a second exposing step is performed. In the second exposing step, the first region of the dry film 54 is shielded by a light-shielding portion 58 of a photomask 57 and irradiated with light 56 to perform pattern exposure. In a case where there is an unexposed portion shielded by the foreign matter on the support 55 in the first exposing step, this unexposed portion is also exposed by the second exposing step. It is desirable that the exposure amount in the second exposing step is an exposure amount that allows the second region to be left in the developing step, that is, an exposure amount equal to or more than the minimum exposure amount of the dry film 54. By this second exposing step, as described in the first embodiment, it is possible to suppress a pattern defect of the dry film 54 caused by the foreign matter on the support 55.

Figure 5G:
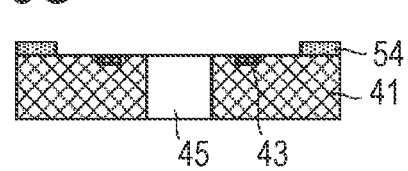
FIG. 5G is a diagram illustrating a manufacturing method for the liquid ejection head according to the third embodiment.

Next, a developing step is performed to develop the dry film 54 and remove the first region of the dry film 54. As a result, as illustrated in FIG. 5G, a second region of the dry film 54 is formed on the substrate 41. In particular, in the present embodiment, the dry film 54 is removed not only from the liquid supply path 45 but also from the position where the energy generating element 43 is formed on one surface of the substrate 41. The developing step itself is performed in the same manner as that described with reference to FIG. 1H in the first embodiment. In the same manner as in the case of the first embodiment, the heat treatment may be performed before the development and the heat treatment may be performed after the developing step.

Figure 5H:
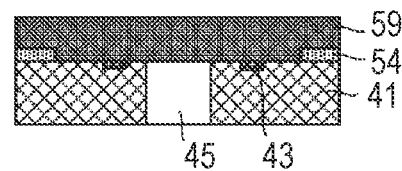
FIG. 5H is a diagram illustrating a manufacturing method for the liquid ejection head according to the third embodiment.

Next, a dry film 59, which is a second photosensitive layer, is prepared in the same manner as illustrated in FIG. 5B and as illustrated in FIG. 5H, the dry film 59 is laminated and bonded to one surface of the substrate 41. This bonding is performed in a manner similar to that described with reference to FIG. 5C. The dry film 59 is a portion of the ejection orifice forming member 42, particularly a first portion 42A (refer to FIG. 4). The thickness of the dry film 59 is, for example, in the range of 5 to 25 µm, which corresponds to the height of the flow path 47 in the ejection orifice forming member 42.

Figure 5I:
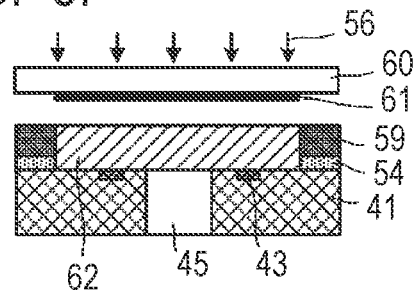
FIG. 5I is a diagram illustrating a manufacturing method for the liquid ejection head according to the third embodiment.

Next, as illustrated in FIG. 5I, by photolithography using a photomask 60, processing is performed to remove a flow path corresponding portion 62, which is a portion corresponding to at least the flow path 47 in the ejection orifice forming member 42, from the dry film 59. The exposing step here is a third exposing step and the flow path corresponding portion 62 is formed as a latent image. In the present embodiment, the flow path corresponding portion 62 also includes a portion corresponding to the pressure chamber 48. In a case where the dry film 59 is a negative photosensitive resin, the portion irradiated with the light 56 remains as a pattern and the portion not irradiated with the light 56 is removed by development. Therefore, in the exposure at this time, the flow path corresponding portion 62 is prevented from being irradiated with the light 56 by the light-shielding portion 61 of the photomask 60. In a case where the negative photosensitive resin used as the dry film 59 is of a chemically amplified type, after exposure via the photomask 60, post exposure bake (PEB: post exposure/pre development bake) is performed before development. The dry film 59 may be developed at this stage. Alternatively, as will be described later, the latent image may be used to develop the dry film 59 together with the developing steps of other films to be laminated and exposed next. In the example illustrated here, the dry film 59 is developed together with the film laminated in the subsequent step. A high-precision alignment is performed by alignment marks (not illustrated) formed on the photomask 60 and the substrate 41, respectively, by using photolithography. Therefore, the flow path 47 and the pressure chamber 48 can be accurately formed at desired positions with reference to the energy generating element 43.

Figure 5J:
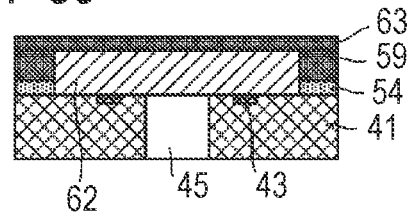
FIG. 5J is a diagram illustrating a manufacturing method for the liquid ejection head according to the third embodiment.

Next, a dry film 63, which is a third photosensitive layer, is prepared in the same manner as that illustrated in FIG. 5B, as illustrated in FIG. 5J, the dry film 63 is laminated on the dry film 59 and a water repellent material (not illustrated) is further laminated on the dry film 63. In laminating the dry film 63, a method similar to that described with reference to FIG. 5C can be used. The dry film 63 is a portion of the ejection orifice forming member 42, particularly a second portion 42B (refer to FIG. 4). The thickness of the dry film is, for example, in the range of 3 to 7 μm, which corresponds to the thickness of the ejection orifice forming member 42 at the position of the ejection orifice 46 formed as a through-hole in the ejection orifice forming member 42. The method of forming the water repellent material is selected according to the material. In a case where the water repellent material is made of, for example, a photosensitive resin composition, a film of the water repellent material may be formed by using, for example, one of a spin coating method and a slit coating method. The film thickness of the water repellent material is, for example, in the range of 0.1 μm to 1 μm. As the water repellent material, for example, an epoxy resin composition containing a fluorine-based water repellent component can be used and other materials can also be used.

Figure 5K:
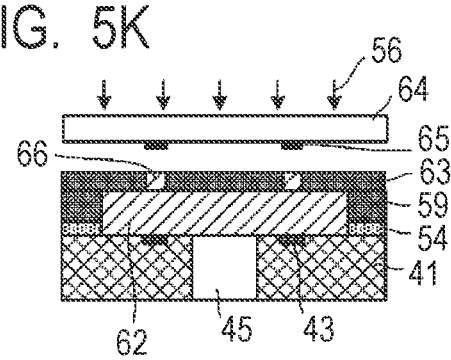
FIG. 5K is a diagram illustrating a manufacturing method for the liquid ejection head according to the third embodiment.

Next, as illustrated in FIG. 5K, by photolithography using a photomask 64, processing is performed to remove an ejection orifice corresponding portion 66, which is a portion corresponding to the ejection orifice 46 in the ejection orifice forming member 42, from the dry film 63 and the water repellent material (not illustrated). For this processing, a method similar to that described with reference to FIG. 5I can be used. The ejection orifice corresponding portion 66 is required to be connected to the flow path corresponding portion 62. The exposing step here is a fourth exposing step and the ejection orifice corresponding portion 66 is formed as a latent image. The photomask 64 is provided with a light-shielding portion 65 corresponding to the position of the ejection orifice 46 on the ejection orifice forming member 42. When both the dry film and the water repellent material (not illustrated) are of the chemically amplified type, PEB can be performed.

Figure 5L:
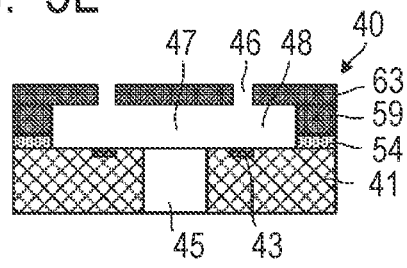
FIG. 5L is a diagram illustrating a manufacturing method for the liquid ejection head according to the third embodiment.

After the end of the exposure illustrated in FIG. 5K, the development treatment is performed and as illustrated in FIG. 5L, the flow path corresponding portion 62 of the dry film 59 and the ejection orifice corresponding portion 66 of the dry film 63 and the water repellent material (not illustrated) are removed. In a case where the dry film 59, the dry film 63 and the water repellent material (not illustrated) are all negative photosensitive resins, the flow path corresponding portion 62 and the ejection orifice corresponding portion 66 can be collectively removed by using the same developing solution as that described with reference to FIG. 1H in the first embodiment. A portion obtained by removing the unexposed portion by development and removing the flow path corresponding portion 62 from the dry film 59 is the flow path 47 and the pressure chamber 48. A portion obtained by removing the ejection orifice corresponding portion 66 from the dry film 63 and the water repellent material (not illustrated) is the ejection orifice 46. A high-precision alignment is performed by alignment marks (not illustrated) formed on the photomask 64 and the substrate 41, respectively, by using photolithography. Therefore, the ejection orifice 46 can be accurately formed at a desired position with reference to the energy generating element 43. Since the flow path 47 and the pressure chamber 48 are already formed at desired positions with high accuracy with reference to the energy generating element 43, according to the present embodiment, the position accuracy between the energy generating element 43, the ejection orifice 46, the flow path 47 and the pressure chamber 48 can be improved.

Through the above steps, a main part of the liquid ejection head 40 in which the liquid supplied from the liquid supply path 45 is ejected from the ejection orifice 46 through the flow path 47 and the pressure chamber 48 is completed. Normally, in the manufacture of the liquid ejection head 40, a silicon wafer corresponding to a plurality of substrates 41 is used and the ejection orifice forming members 42 corresponding to a plurality of liquid ejection heads 40 are collectively formed on one surface of the silicon wafer. Therefore, when the main part of the liquid ejection head 40 is completed as described above, the main part is cut and separated by dicing to obtain a plurality of chips corresponding to one liquid ejection head 40, respectively. After mounting the electric wiring that drives the energy generating element 43 in each chip, a chip tank member for liquid supply is bonded. As a result, the liquid ejection head 40 is finally completed.

According to the present embodiment, even when the foreign matter is present on the support 55 when the dry film 54 is exposed via the support 55, it is possible to suppress the occurrence of a pattern formation defect caused by the foreign matter. Therefore, in the liquid ejection head 40 according to the present embodiment, the occurrence of the pattern defect in the adhesion layer provided between the substrate 41 and the ejection orifice forming member 42 is suppressed and high reliability in the adhesion between the substrate 41 and the ejection orifice forming member 42 can be obtained. In a case where the liquid ejection head is used in a field such as commercial printing, it is necessary to maintain stable recording quality even when the recording liquid is ejected on a large amount of recording media. Therefore, it is necessary to improve the adhesion of the ejection orifice forming member 42 to the substrate 41. According to the present embodiment, it is possible to obtain a liquid ejection head 40 that can be used with high reliability even in fields such as commercial printing.

Manufacturing Example 1

Hereinafter, an example in which the liquid ejection head 40 is manufactured based on the third embodiment will be described. First, as illustrated in FIG. 5A, a substrate 41 having a thickness of 625 μm made of single crystal silicon in which a plurality of energy generating elements 43 such as a heat generating resistor was disposed was prepared. The liquid supply path 45 was formed in advance on the substrate 41. As illustrated in FIG. 5B, a PET film having a thickness of 100 μm was used as the support 55 and a dry film 54 containing an epoxy resin (including N-695), which was a negative photosensitive resin composition, was prepared on the surface of the support 55. The film thickness of the dry film 54 was 1 μm. As illustrated in FIG. 5C, the substrate 41 and the dry film 54 were attached to each other and laminated by a laminating method under vacuum under the conditions of a stage temperature of 50° C., a roller temperature of 50° C., a roller pressure of 0.2 MPa and a roller speed of 1 mm/s. A roll laminating device was used for laminating. After bonding by laminating, as illustrated in FIG. 5D, a first exposing step was performed by exposing the entire surface of the dry film 54 via the support 55 with light 56 having a wavelength of 365 nm using an exposure machine. The exposure amount at this time was 1500 J/m². This exposure amount is less than the minimum exposure amount $E_{th}$ of the dry film 54. After the first exposing step was performed, PEB was performed at a temperature of 50° C. for 4 minutes.

Next, as illustrated in FIG. 5E, the support 55 was removed from the substrate 41 at room temperature. At this time, the dry film 54 did not peel off from the substrate 41. The dry film 54 was tented on the liquid supply path 45. Thereafter, as illustrated in FIG. 5F, a second exposing step was performed in which the dry film 54 was pattern-exposed with light 56 having a wavelength of 365 nm from the exposure machine via a photomask 57. The exposure amount in the second exposing step was 4000 J/m². This exposure amount is an exposure amount that exceeds the minimum exposure amount $E_{th}$ of the dry film 54. After the second exposing step was performed, PEB was performed at a temperature of 90° C. for 4 minutes. After completion of PEB, as illustrated in FIG. 5G, a developing step using PGMEA as a developing solution was performed. As a result, an adhesion layer made of a pattern of the dry film 54 was formed on the substrate 41. As a result of evaluating the shape of the adhesion layer made of the pattern of the dry film 54, a pattern defect believed to be derived from the foreign matter on the support 55 was not detected.

After the developing step was performed, as illustrated in FIG. 5H, on the substrate 41 having the pattern of the dry film 54, the dry film 59 to be the ejection orifice forming member 42 was laminated and bonded in the same manner as described with reference to FIGS. 5B and 5C. The dry film 59 was supported by a support (not illustrated) different from the support 55, which was the first support. The film thickness of the dry film 59 was 15 μm. The bonding of the dry film 59 to the substrate 41 was performed by a laminating treatment under vacuum using a roll type laminating device and the conditions at this time were a stage temperature of 50° C., a roller temperature of 50° C., a roller pressure of 0.2 MPa and a roller speed of 5 mm/s. Thereafter, the support (not illustrated) was peeled off at room temperature in the same procedure as that described with reference to FIG. 5E.

Next, as illustrated in FIG. 5I, the dry film 59 was irradiated with light 56 having a wavelength of 365 nm from the exposure machine via the photomask 60 to perform pattern exposure. The exposure amount was 10000 J/m². After the pattern exposure was performed, PEB was performed at a temperature of 60° C. for 4 minutes and thus a latent image was formed so that the flow path corresponding portion 62, which was an unexposed portion of the dry film 59, was the flow path 47 and the pressure chamber 48 in the ejection orifice forming member 42. After forming the latent image, as illustrated in FIG. 5J, the dry film 63 and the water repellent material (not illustrated) were laminated on the dry film 59. The dry film 63 was made of the same negative epoxy resin as the dry film 54 and was prepared on a support (not illustrated) in the same manner as the method illustrated in FIG. 5B. The dry film 63 was laminated on the dry film 59 by a laminating treatment under vacuum using a roll laminating device and the conditions at that time were a stage temperature of 50° C., a roller temperature of 50° C., a roller pressure of 0.2 MPa and a roller speed of 5 mm/s. After laminating on the dry film 59, the support (not illustrated) supporting the dry film 63 was peeled off at room temperature. The film thickness of the dry film 63 was 5 μm. The water repellent material (not illustrated) was an epoxy resin containing a fluorine-based water repellent component, was formed to a film thickness of 0.6 μm by a slit coating method and then baked at 50° C. for 5 minutes to form a layer of the water repellent material on the surface of the dry film 63.

Next, as illustrated in FIG. 5K, the dry film 63 and the water repellent material (not illustrated) were irradiated with light 56 having a wavelength of 365 nm from the exposure machine via the photomask 64 to perform pattern exposure. The exposure amount was 1000 J/m². After the pattern exposure was performed, PEB was performed at a temperature of 90° C. for 4 minutes and thus a latent image was formed so that the ejection orifice corresponding portion 66, which was an unexposed portion of the dry film 63 and the water repellent material, was the ejection orifice 46 in the ejection orifice forming member 42. Subsequently, PGMEA was used as a developing solution to perform development for removing the latent image portion and as illustrated in FIG. 5L, the flow path corresponding portion 62 of the dry film 59, the dry film 63 and the ejection orifice corresponding portion 66 of the water repellent material (not illustrated) were collectively removed. In this manner, the ejection orifice 46 of the ejection orifice forming member 42, the flow path 47 and the pressure chamber 48 are formed. Thereafter, the heat treatment was performed at a temperature of 200° C. for one hour in a nitrogen atmosphere to cure the ejection orifice forming member 42 made of a negative photosensitive resin. Thereafter, dicing, mounting of the electric wiring and bonding of the chip tank member were performed as described above to complete the liquid ejection head 40.

Manufacturing Example 2

The liquid ejection head 40 was manufactured by the same steps as those in Manufacturing Example 1 described with reference to FIGS. 5A to 5L. In Manufacturing Example 1, when the support 55 was removed from the substrate 41 after the first exposing step, the dry film 54 was tented on the liquid supply path 45 as illustrated in FIG. 5E.

On the other hand, in Manufacturing Example 2, the dry film 54 on the liquid supply path 45 remained on the support 55 side (not illustrated). Since the first region of the dry film 54 at the position corresponding to the liquid supply path 45 is a region removed in the developing step illustrated in FIG. 5G, the dry film 54 may remain on the support 55 side. As a result of actually evaluating the shape of the adhesion layer made of the pattern of the dry film 54 after the developing step was performed, no pattern defect believed to be derived from the foreign matter on the support 55 was detected even in Manufacturing Example 2. As described above, also in Manufacturing Example 2, the pattern defect in the adhesion layer between the substrate 41 and the ejection orifice forming member 42 is suppressed and it is possible to form the liquid ejection head 40 having high reliability in the adhesion between the substrate 41 and the ejection orifice forming member 42.

Fourth Embodiment

Figure 6A:
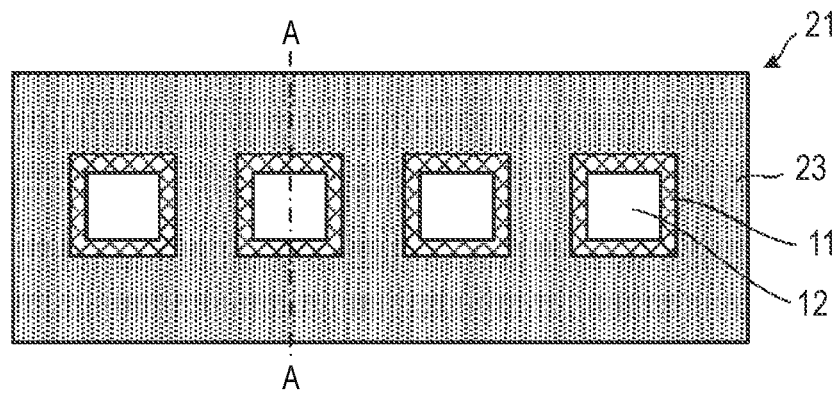
FIG. 6A is a diagram illustrating a manufacturing method for a structure according to a fourth embodiment.

Although the above-described first and second embodiments use the dry film which is a negative photosensitive resin, the present disclosure can also be performed by using a positive photosensitive resin. In a fourth embodiment, a case where a pattern is formed on the substrate 11 by using the dry film 23 which is a positive photosensitive resin to form a structure 21 having the same shape as the structure 10 of the first embodiment will be described. FIGS. 6A to 6H are views illustrating a manufacturing method for a structure according to the fourth embodiment and FIG. 6A is a plan view of the structure 21 to be formed on the substrate 11. The structure 21 is the same as that illustrated in FIG. 1A, except that the dry film provided on one surface of the substrate 11 is a positive dry film 23. FIGS. 6B to 6H are cross-sectional views taken along line A-A of FIG. 6A and illustrate a manufacturing process in the present embodiment step by step.

Figure 6B:
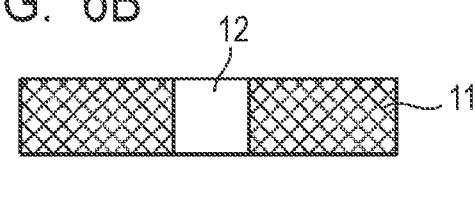
FIG. 6B is a diagram illustrating a manufacturing method for the structure according to the fourth embodiment.

FIG. 6B illustrates the substrate 11 and the substrate 11 is the same as that illustrated in FIG. 1B. As illustrated in FIG. 6C, the dry film 23 formed on the support 14 which is the first support is prepared separately from the substrate 11. As the support 14, the one described in the first embodiment can be used and as the dry film 23, one made of a positive photosensitive resin is used. The forming method for the dry film 23 on the support 14 is the same as that in the case of the first embodiment. In addition, similarly to the first embodiment, the dry film 23 is divided into a first region removed by the developing step and a second region left even after the developing step. As illustrated in FIG. 6D, the dry film 23 is attached to and laminated on the substrate 11 via the support 14 so that the dry film 23 is in contact with one surface of the substrate 11. The bonding by laminating is also performed in the same manner as in the case of the first embodiment. After bonding, as illustrated in FIG. 6E, a first exposing step of exposing the entire surface of the dry film 23 via the support 14 is performed. The exposure amount in the first exposing step is such that at least the second region is exposed with an exposure amount less than the minimum exposure amount. Since the positive dry film 23 is used here, the minimum exposure amount is an exposure amount at which the dry film 23 is removed in the developing step when the exposure amount is equal to or more than the exposure amount thereof.

Figure 6F:
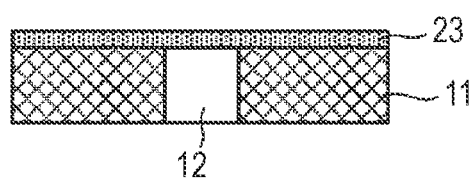
FIG. 6F is a diagram illustrating a manufacturing method for the structure according to the fourth embodiment.
Figure 6C:
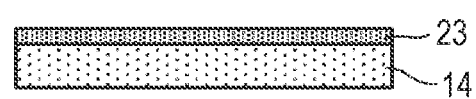
FIG. 6C is a diagram illustrating a manufacturing method for the structure according to the fourth embodiment.
Figure 6G:
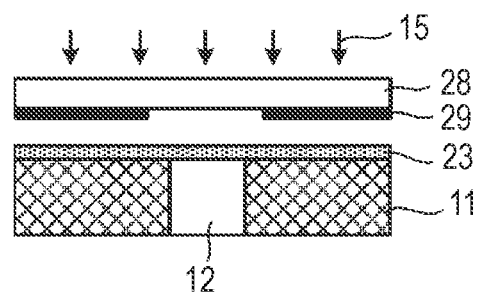
FIG. 6G is a diagram illustrating a manufacturing method for the structure according to the fourth embodiment.
Figure 6D:
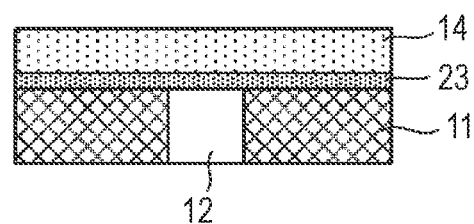
FIG. 6D is a diagram illustrating a manufacturing method for the structure according to the fourth embodiment.
Figure 6H:
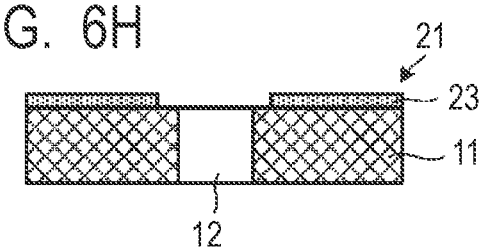
FIG. 6H is a diagram illustrating a manufacturing method for the structure according to the fourth embodiment.
Figure 6E:
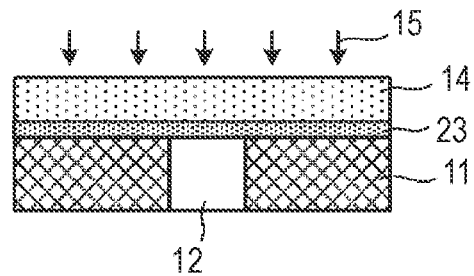
FIG. 6E is a diagram illustrating a manufacturing method for the structure according to the fourth embodiment.

After the first exposing step is performed, the support 14 is removed from the substrate 11 as illustrated in FIG. 6F. This removing step is also performed in the same manner as in the case of the first embodiment. At this time, the dry film 23 at the position of the opening 12 of the substrate 11 can be tented on the opening 12 and since this region is a region removed by the developing step, the dry film 23 may remain on the side of the support 14. After removing the support 14, a second exposing step is performed as illustrated in FIG. 6G. In the second exposing step, pattern exposure is performed on the dry film 23 via a photomask 28. Unlike the case of the first embodiment, the photomask 28 is formed with a light-shielding portion 29 so that the second region of the dry film 23 is not exposed to the light 15. Thereafter, by performing the developing step, as illustrated in FIG. 6H, the structure 21 having the second region of the dry film 23 is formed on the substrate 11. According to the present embodiment, even when the foreign matter is present on the support 14, the second exposing step makes it possible to suppress a pattern formation defect caused by the foreign matter in the same manner as in the case of the first embodiment.

Manufacturing Example 3

An example in which the structure 21 is actually manufactured based on the fourth embodiment will be described. As illustrated in FIG. 6C, a PET film having a thickness of 100 μm is used as the support 14 and a dry film 23 using a positive photosensitive resin composition (trade name: PMER, manufactured by TOKYO OHKA KOGYO Co., Ltd.) was prepared on the support 14. The film thickness of the dry film was 1 μm. The bonding between the dry film 23 and the substrate 11 illustrated in FIG. 6D was performed by a laminating treatment under vacuum using a roll laminating device. In the first exposing step illustrated in FIG. 6E, light 15 having a wavelength of 365 nm was exposed to the entire surface of the dry film 23 via the support 14 using an exposure machine. The exposure amount at this time was equal to or less than the minimum exposure amount of the dry film 23. After the first exposing step was performed, PEB was performed and then, as illustrated in FIG. 6F, the support 14 was removed from the substrate 11 at room temperature.

Next, a second exposing step illustrated in FIG. 6G was performed. In the second exposing step, the dry film 23 was pattern-exposed with light 15 having a wavelength of 365 nm from the exposure machine via the photomask 28. The exposure amount at this time was set to an exposure amount equal to or more than the minimum exposure amount of the dry film 23. After the second exposing step was performed, PEB was performed, a developing step using an aqueous TMAH solution as a developing solution was further performed and as illustrated in FIG. 6H, a structure 21 having the pattern of the dry film 23 was formed on the substrate 11. As a result of inspecting the shape of the structure 21, no pattern defect believed to be derived from the foreign matter on the support 14 was detected.

Fifth Embodiment

As a fifth embodiment, another example of a manufacturing method for the liquid ejection head 40 will be described. In the third embodiment, although development is performed twice for forming the liquid ejection head 40, in the fifth embodiment, the liquid ejection head 40 is manufactured by one development. The liquid ejection head 40 to be manufactured here is the same as that illustrated in the third embodiment and the difference is that the cross-sectional shape of the liquid supply path 45 is tapered so that the opening on one surface of the substrate 41 is narrower than the opening on the other surface. FIGS. 7A to 7I are cross-sectional views taken along line B-B of FIG. 4 and illustrate a manufacturing process of the liquid ejection head 40 in the present embodiment step by step.

Figure 7A:
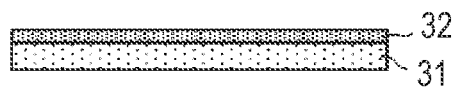
FIG. 7A is a diagram illustrating a manufacturing method for a liquid ejection head according to a fifth embodiment.

First, as illustrated in FIG. 7A, a first photosensitive layer 32 is formed on a support 31 which is the first support. The first photosensitive layer 32 is a layer disposed to improve the adhesion between the substrate 41 and the ejection orifice forming member 42. Although the first photosensitive layer 32 is not particularly limited as long as the first photosensitive layer 32 is a photosensitive layer and in the present embodiment, a photoresist made of a negative photosensitive resin is used. The first photosensitive layer 32 has a softening point of approximately 40° C. to 120° C. and the same material as that in the first embodiment can be used. In addition, it is desirable that a silane coupling agent is internally added to the first photosensitive layer 32 in order to enhance the adhesion. The first photosensitive layer 32 can be formed on the surface of the support 31 in the same manner as that in the first embodiment. The first photosensitive layer 32 can be formed on the surface of the support 31 with a thickness of 0.5 to 2 μm. In order to form the first photosensitive layer 32 having this thickness, the viscosity of the solution of the first photosensitive layer 32 can be 3 to 20 centipoise (cP). As the solvent used for forming the solution of the first photosensitive layer 32, the solvent described in the first embodiment can be used.

As described later, since the first photosensitive layer 32 on the substrate 41 is exposed (patterned) via the support 31, one of a glass substrate and an optical film having high light transmission is can be used for the support 31. Examples of the optical film that can be used include those made of one of an olefin film and a PET film. In addition, in order to transfer the first photosensitive layer 32 onto the substrate 41 with high accuracy, the support 31 can be made of a material having low flexibility and can have a flexural rigidity higher than that of the substrate 41. Since the flexural rigidity depends on the thickness of the member, the thickness of the support 31 can be appropriately set according to the thickness of the substrate 41. In addition, in order to facilitate the peeling off the support 31 from the first photosensitive layer 32 in the subsequent step, the support 31 may be subjected to a mold release treatment. As a mold release treatment on the support 31, for example, a thin film to be a release film can be applied onto the support 31 to form the thin film. For the thin film to be the release film, for example, one of a highly water repellent silicone resin and a resin containing a fluorine compound can be used.

Figure 7B:
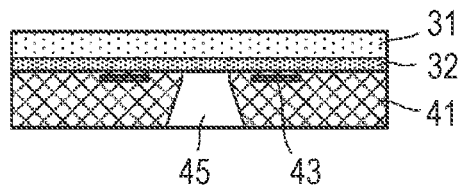
FIG. 7B is a diagram illustrating a manufacturing method for the liquid ejection head according to the fifth embodiment.

Next, as illustrated in FIG. 7B, the first photosensitive layer 32 formed on the support 31 is turned upside down and placed on the substrate 41 so that the first photosensitive layer 32 is in contact with one surface of the substrate 41. By placing the first photosensitive layer 32 on the substrate 41, the liquid supply path 45 is blocked by the first photosensitive layer 32. Next, the first photosensitive layer 32 is laminated and bonded to the substrate 41 by applying pressure to deform the first photosensitive layer 32 under temperature conditions exceeding the softening point of the first photosensitive layer 32. Examples of the method of bonding the first photosensitive layer 32 to the substrate 41 include a laminating method and a pressing method. The substrate 41 is made of silicon, a liquid supply path 45 penetrating in the thickness direction thereof is formed in advance by silicon etching and an energy generating element 43 and a driving circuit (not illustrated) thereof are formed in advance on one surface of the substrate 41. The liquid supply path 45 is formed by forming a mask resist having an opening pattern of the liquid supply path 45 on the substrate 41 on which the energy generating element 43 is already formed and performing wet etching with one of an aqueous solution of TMAH and an aqueous solution of potassium hydroxide. Other etching methods include dry etching methods such as reactive ion etching (RIE). Examples of still another method of forming the liquid supply path 45 include a blasting method such as laser ablation and sandblasting. In a case where an electric heat converter is used as the energy generating element 43, a removable protective film may be attached to prevent the energy generating element 43 from being damaged when the liquid supply path 45 is formed on the substrate 41.

Figure 7C:
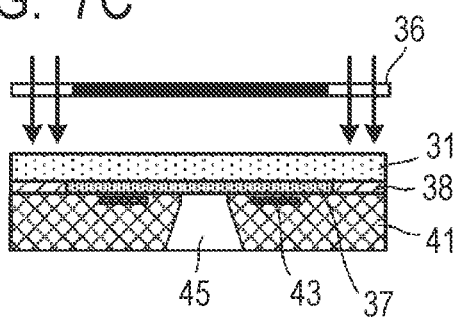
FIG. 7C is a diagram illustrating a manufacturing method for the liquid ejection head according to the fifth embodiment.

After the first photosensitive layer 32 is laminated and bonded to the substrate 41, as illustrated in FIG. 7C, as a first exposing step, the first photosensitive layer 32 is irradiated with light in the direction of the arrow via the support 31 and the photomask 36 to perform an exposure treatment. The photomask 36 is formed with a light transmitting portion illustrated in white blank in the drawing and a light-shielding portion illustrated in black. As a result of the exposure treatment, the first photosensitive layer 32 is formed with an unexposed portion 37 in which light is shielded by the photomask 36 and an exposed portion 38 irradiated with light. As described later, an adhesion layer 71 for improving the adhesion between the substrate 41 and the ejection orifice forming member 42 is formed from the exposed portion 38 of the first photosensitive layer 32.

Figure 7D:
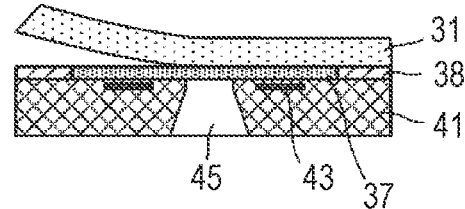
FIG. 7D is a diagram illustrating a manufacturing method for the liquid ejection head according to the fifth embodiment.

Next, as illustrated in FIG. 7D, the support 31 is peeled off from the first photosensitive layer 32. As a method of peeling the support 31, there is a method of peeling while bending the support 31. In addition, in order to facilitate peeling off the support 31, a release film may be applied to the support 31 side before forming the first photosensitive layer 32. By peeling off the support 31, the first photosensitive layer 32 is bonded onto the substrate 41.

Figure 7E:
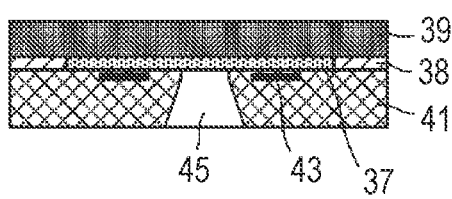
FIG. 7E is a diagram illustrating a manufacturing method for the liquid ejection head according to the fifth embodiment.

Subsequently, as illustrated in FIG. 7E, a second photosensitive layer 39 is placed and laminated on the first photosensitive layer 32. Although not illustrated here, the second photosensitive layer 39 is formed on a support different from the first support 31 and the second photosensitive layer 39 on the support is turned upside down and placed on the first photosensitive layer 32 formed on the substrate 41. The second photosensitive layer 39 is finally a member constituting at least a flow path 47 in the ejection orifice forming member 42, corresponding to the first layer 42A in the ejection orifice forming member 42. In addition, the second photosensitive layer 39 is also a member constituting the pressure chamber 48. Although the second photosensitive layer 39 is not particularly limited as long as the second photosensitive layer 39 is a photosensitive layer and in the present embodiment, a photoresist made of a negative photosensitive resin is used. The second photosensitive layer 39 has a softening point of approximately 60° C. to 120° C. and the material described in the first embodiment can be used as in the case of FIG. 7A. As a method of forming the second photosensitive layer 39 on a support (not illustrated), the method described in the first embodiment can be used as in the case of FIG. 7A. The second photosensitive layer 39 can be formed with a thickness of 3 to 25 μm. Examples of the laminating method for the second photosensitive layer 39 on the first photosensitive layer 32 include a laminating method and a pressing method. At the time of laminating, pressure can be applied to the second photosensitive layer 39 under a temperature condition exceeding the softening point of the second photosensitive layer 39. In the present embodiment, although the unexposed portion 37 and the exposed portion 38 are formed on the first photosensitive layer 32, since the upper surface of the first photosensitive layer 32 is flat, the second photosensitive layer 39 can be stably placed and laminated on the first photosensitive layer 32.

Figure 7F:
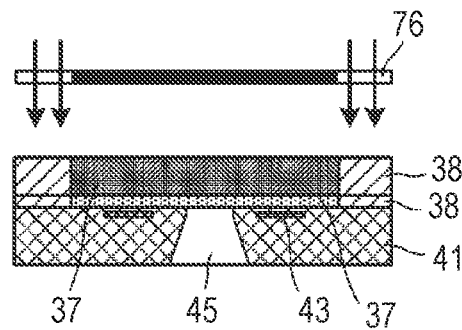
FIG. 7F is a diagram illustrating a manufacturing method for the liquid ejection head according to the fifth embodiment.

After the second photosensitive layer 39 is bonded on the first photosensitive layer 32, as illustrated in FIG. 7F, as a second exposing step, the second photosensitive layer 39 is irradiated with light in the direction of the arrow via the photomask 76 to perform an exposure treatment. The photomask 76 may have the same light-shielding portion pattern as that of the photomask 36 used in the first exposing step. The second photosensitive layer 39 can be a layer that is exposed to light having the same wavelength as that of the first photosensitive layer 32 and is, for example, photosensitive with a wavelength of 365 nm. The sensitivity of the second photosensitive layer 39 can be the same as or lower than the sensitivity of the first photosensitive layer 32. As an example, the materials constituting the first photosensitive layer 32 and the second photosensitive layer 39 are determined so that the minimum exposure amount of the first photosensitive layer 32 is 0.5 when the minimum exposure amount of the second photosensitive layer 39 is 1. When the support (not illustrated) used to form the second photosensitive layer 39 is not peeled off and removed before the second exposing step is performed, the support is peeled off and removed after the second exposing step is performed. In the second exposing step, the unexposed portion 37 and the exposed portion 38 are also formed on the second photosensitive layer 39. The unexposed portion 37 corresponds to a latent image formed on the second photosensitive layer 39 as a portion of the ejection orifice forming member 42 corresponding to at least the flow path 47.

Figure 7G:
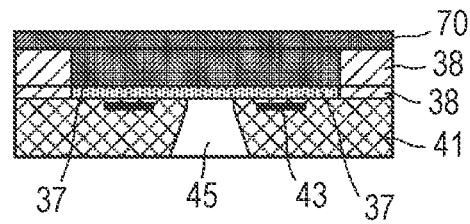
FIG. 7G is a diagram illustrating a manufacturing method for the liquid ejection head according to the fifth embodiment.

Subsequently, as illustrated in FIG. 7G, the third photosensitive layer 70 is placed and laminated on the second photosensitive layer 39. Although not illustrated here, the third photosensitive layer 70 is also formed on a support different from the support 31 which is the first support and the third photosensitive layer 70 on the support is turned upside down and placed on the second photosensitive layer 39. Although not illustrated, a film having water repellency, that is, a water repellent film may be formed on the third photosensitive layer 70. The water repellent film can be a film containing one of a silicon and fluorine-based water repellent component. The third photosensitive layer 70 is a plate-shaped portion of the ejection orifice forming member 42 on which the ejection orifice 46 is provided, that is, a second layer 42B. Although the third photosensitive layer 70 is not particularly limited as long as the third photosensitive layer 70 is a photosensitive layer and in the present embodiment, a photoresist made of a negative photosensitive resin is used. The third photosensitive layer 70 has a softening point of approximately 40° C. to 60° C. and the material described in the first embodiment can be used as in the case of FIG. 7A. As a method of forming the third photosensitive layer 70 on a support (not illustrated), the method described in the first embodiment can be used as in the case of FIG. 7A. The third photosensitive layer 70 can be formed with a thickness of 3 to 20 μm. Examples of the laminating method for the third photosensitive layer 70 on the second photosensitive layer 39 include a laminating method and a pressing method.

Figure 7H:
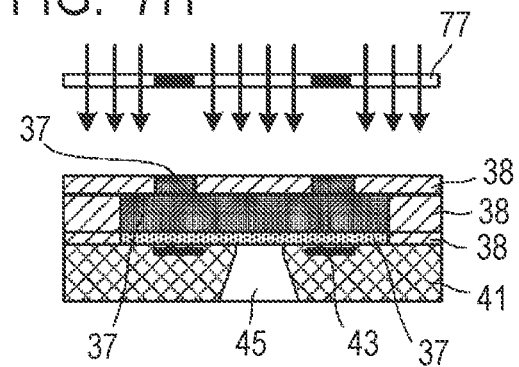
FIG. 7H is a diagram illustrating a manufacturing method for the liquid ejection head according to the fifth embodiment.

After the third photosensitive layer 70 is bonded on the second photosensitive layer 39, as illustrated in FIG. 7H, as a third exposing step, the third photosensitive layer 70 is irradiated with light in the direction of the arrow via the photomask 77 to perform an exposure treatment. The photomask 77 is provided with a light-shielding portion corresponding to the position where the ejection orifice 46 is formed in the ejection orifice forming member 42. When the third photosensitive layer 70 is exposed, it is desired that the first photosensitive layer 32 and the second photosensitive layer 39 are not exposed to light. Therefore, the third photosensitive layer 70 can have a photosensitivity to a wavelength different from those of the first photosensitive layer 32 and the second photosensitive layer 39. Alternatively, when the third photosensitive layer 70 is exposed at the same wavelength as those of the first photosensitive layer 32 and the second photosensitive layer 39, it is desired that the sensitivity of the third photosensitive layer 70 at the exposure wavelength is higher than the sensitivity of the first photosensitive layer 32 and the second photosensitive layer 39. Here, high sensitivity means that the minimum exposure amount is small. As an example, the materials constituting the third photosensitive layer 70 is determined so that the minimum exposure amount of the third photosensitive layer 70 is 0.1 when the minimum exposure amount of the second photosensitive layer 39 is 1 at the exposure wavelength. By the third exposing step is performed, the unexposed portion 37 and the exposed portion 38 are also formed on the third photosensitive layer 70. The unexposed portion 37 corresponds to a latent image formed on the third photosensitive layer 70 as a portion of the ejection orifice forming member 42 corresponding to at least the ejection orifice 46. When the third exposing step is performed, the support (not illustrated) used for forming the third photosensitive layer 70 can be peeled off from the third photosensitive layer 70 before the exposure. In addition, after the support is peeled off, an additional exposure treatment may be performed using the photomasks 36 and 76 used in one of the first exposing step and the second exposing step. The reason for this is that since the third photosensitive layer 70 is the outermost layer, when a foreign matter is present on the support, the foreign matter may be an obstructive factor at the time of exposure and cause a pattern defect.

Figure 7I:
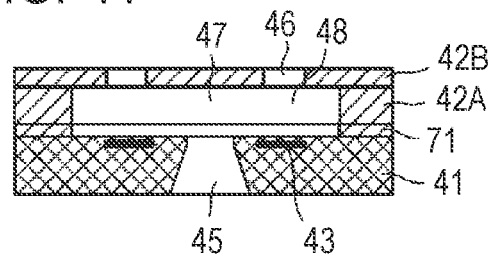
FIG. 7I is a diagram illustrating a manufacturing method for the liquid ejection head according to the fifth embodiment.

As illustrated in FIG. 7I, the unexposed portion 37 in the photosensitive layers 32, 39 and 70 is removed by performing a developing step of immersing the substrate 41 to which the photosensitive layers 32, 39 and 70 are bonded in a developing solution after the third exposing step. As a result, an adhesion layer between the ejection orifice forming member 42 and the substrate 41 is formed from the first photosensitive layer 32, the first layer 42A of the ejection orifice forming member 42 is formed from the second photosensitive layer 39 and the second layer 42B of the ejection orifice forming member 42 is formed from the third photosensitive layer 70. In this developing step, the first photosensitive layer 32, the second photosensitive layer 39 and the third photosensitive layer 70 are simultaneously developed at the same time. As the developing solution, the material described in the first embodiment can be used. In addition, after performing a developing treatment using a developing solution, a treatment of cleaning the substrate 41 with a rinsing solution may be performed. As the rinsing solution, one of isopropyl alcohol, ethanol and pure water can be used.

By going through each of the steps illustrated in FIGS. 7A to 7I, the main part of the liquid ejection head 40 in which the liquid supplied from the liquid supply path 45 as illustrated in FIG. 4 is ejected from the ejection orifice 46 through the flow path 47 and the pressure chamber 48 is completed. By mounting a member (not illustrated) for supplying the liquid to the liquid supply path 45 and an electric wiring (not illustrated) for driving the energy generating element 43 on this main part, the liquid ejection head 40 is finally completed.

Figure 8A:
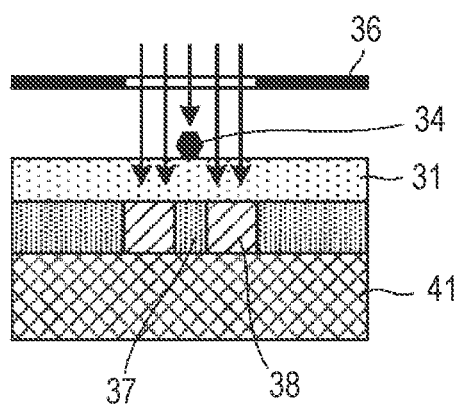
FIG. 8A is a diagram illustrating an influence of a foreign matter on the support.
Figure 8B:
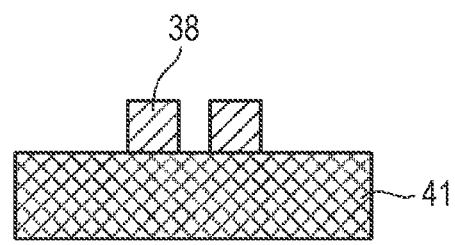
FIG. 8B is a diagram illustrating the influence of the foreign matter on the support.

Here, with reference to FIGS. 8A and 8B, exposure in a case where a foreign matter 34 is present on the support 31 in the first exposing step will be described. As illustrated in FIG. 8A, when an opaque foreign matter 34 is present on the support 31, the light transmitted through the photomask 36 in the first exposing step is shielded by the foreign matter 34. As a result, an unexposed portion 37 is generated in the first photosensitive layer 32. Thereafter, when development is performed, as illustrated in FIG. 8B, an unintended loss occurs in the pattern. Therefore, in the present embodiment, the first exposing step of exposing the first photosensitive layer 32 via the first photomask 36 is performed and thereafter the support 31 is removed. The second photosensitive layer 39 is laminated on the first photosensitive layer 32 after the support 31 is removed and before the second exposing step is performed. In the second exposing step, the second photomask 76 is used to perform pattern exposure of the second photosensitive layer 39 and the first photosensitive layer 32 is also exposed via the second photosensitive layer 39. As a result, the unexposed portion 37 generated by the foreign matter 34 in the first exposing step is also exposed. As a result, the generation of the unexposed portion 37 formed by being shielded from light by the foreign matter 34 is suppressed, so that the pattern loss due to the foreign matter 34 is suppressed. That is, in this case, it can be said that the second exposing step is a step of exposing the first photosensitive layer 32 without using the first support 31 used for forming the first photosensitive layer 32. Since the first photosensitive layer 32 has higher sensitivity than that of the second photosensitive layer 39, the light passing through the second photosensitive layer 39 can sufficiently expose the first photosensitive layer 32.

Manufacturing Example 4

An example in which the liquid ejection head 40 is actually manufactured based on a fifth embodiment will be described. A silicon substrate was used as the substrate 41. In a step of providing the liquid supply path 45 on the substrate 41, the liquid supply path 45 was formed on the substrate 41 by immersing the substrate 41 in an aqueous solution (etching solution) in which TMAH was diluted to 22% and the temperature was adjusted to 83° C. for 20 hours. As the support 31, an optical film having a thickness of 100 μm was used. As illustrated in FIG. 7A, the first photosensitive layer 32 is applied to the surface of the support 31 to a thickness of 1 μm by a spin coating method, dried in an oven at a temperature of 50° C. to prepare the first photosensitive layer 32 on the support 31. As the first photosensitive layer 32, an epoxy resin and a photoinitiator dissolved in a solvent (PGMEA) were used. The photoinitiator was an agent for initiating photopolymerization when pattern formation was performed using photolithography in the first exposing step and was sensitive to light having a wavelength of 365 nm.

Next, as illustrated in FIG. 7B, the first photosensitive layer 32 held by the support 31 was bonded to the substrate 41 on which the liquid supply path 45 was formed by using a vacuum laminating method. At that time, in order to ensure the accuracy of the thickness of the first photosensitive layer 32 formed on the substrate 41, the temperature and pressure were regulated according to the softening point of the material of the first photosensitive layer 32. Specifically, the first photosensitive layer 32 was bonded to the substrate 41 by pressurizing under the conditions of a temperature of 50° C., a pressure of 0.4 MPa and a pressurizing time of 60 seconds so that the thickness of the first photosensitive layer 32 was 1 μm. Thereafter, as illustrated in FIG. 7C, a first exposing step was performed. In the first exposing step, a photomask 36 was used to irradiate the first photosensitive layer 32 with light having a wavelength of 365 nm at an exposure amount of 5000 J/m$^2$ via the support 31 to perform pattern exposure. Next, PEB was performed at a temperature of 50° C. for 5 minutes and thereafter the support 31 was peeled off from the first photosensitive layer 32.

Next, as illustrated in FIG. 7E, the second photosensitive layer 39 was laminated on the first photosensitive layer 32 formed on the substrate 41. The second photosensitive layer 39 is prepared by applying the layer to a support made of an optical film having a thickness of 100 μm to a thickness of 15 μm by a spin coating method and drying in an oven at 50° C. The laminating of the second photosensitive layer 39 on the first photosensitive layer 32 was performed by a vacuum laminating method in which the second photosensitive layer 39 was placed on the first photosensitive layer 32 together with the support so as to be in contact with the first photosensitive layer 32. At that time, the temperature and pressure were regulated according to the softening point of the material of the first photosensitive layer 32 so as not to soften the first photosensitive layer 32 too much. Specifically, the second photosensitive layer 39 was bonded to the first photosensitive layer 32 under the conditions of a temperature of 70° C., a pressure of 0.4 MPa and a pressurizing time of 60 seconds. Next, as illustrated in FIG. 7F, in the second exposing step, the photomask 76 was used, the second photosensitive layer 39 was irradiate with light having a wavelength of 365 nm at an exposure amount of 10000 J/m$^2$ to perform pattern exposure. Next, PEB was performed at a temperature of 50° C. for 5 minutes.

Next, as illustrated in FIG. 7G, the third photosensitive layer 70 was laminated on the second photosensitive layer 39. The third photosensitive layer 70 is prepared by applying the layer to a support made of an optical film having a thickness of 100 μm to a thickness of 10 μm by a spin coating method and drying in an oven at 50° C. The laminating of the third photosensitive layer 70 on the second photosensitive layer 39 was performed by a vacuum laminating method in which the third photosensitive layer 70 was placed on the second photosensitive layer 39 together with the support so as to be in contact with the second photosensitive layer 39. For the bonding of the third photosensitive layer 70, the same conditions as the bonding conditions of the first photosensitive layer 32 were used. Next, as illustrated in FIG. 7H, in the third exposing step, a photomask 77 was used, the third photosensitive layer 70 was irradiate with light having a wavelength of 365 nm at an exposure amount of 1000 J/m$^2$ to perform pattern exposure. Next, PEB was performed at a temperature of 90° C. for 5 minutes. Next, development was performed using PGMEA as a developing solution using a single-wafer dip developing device. As a result, each of the unexposed portions 37 of the first photosensitive layer 32, the second photosensitive layer 39 and the third photosensitive layer 70 is removed and the main part of the liquid ejection head 40 having the cross-sectional structure of FIG. 7I was obtained.

Sixth Embodiment

The manufacturing method for the structure based on the present disclosure is not used only for manufacturing the liquid ejection head. When a recessed portion is formed on the surface of the substrate, the recessed portion can also be used for manufacturing a structure having one of a shape that covers the recessed portion and a shape that straddles the recessed portion. FIGS. 9A to 9H are cross-sectional views illustrating a manufacturing process of a structure according to a sixth embodiment of the present disclosure step by step.

Figure 9A:
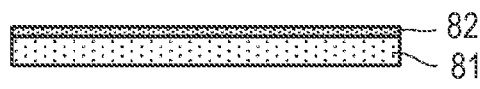
FIG. 9A is a diagram illustrating a manufacturing method for a structure according to a sixth embodiment.

First, as illustrated in FIG. 9A, a first photosensitive layer 82 is formed on a support 81, which is the first support. As the support 81, the same support as the support 31 in the fifth embodiment can be used. The first photosensitive layer 82 is a photoresist having photosensitivity, may be one of a positive and a negative and here, a positive photoresist is used. As a forming method for the first photosensitive layer 82 on the support 81, the same method as that described in the fifth embodiment can be used.

Figure 9B:
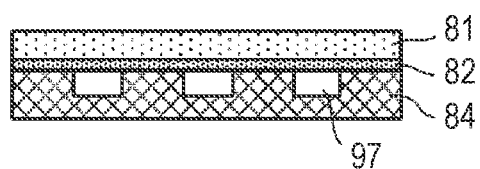
FIG. 9B is a diagram illustrating a manufacturing method for the structure according to the sixth embodiment.

Next, as illustrated in FIG. 9B, the first photosensitive layer 82 formed on the support 81 is turned upside down and placed on the substrate 84 so that the first photosensitive layer 82 is in contact with one surface of the substrate 84. For example, a groove-shaped recessed portion 97 is previously formed on one surface of the substrate 84. The recessed portion 97 may be a through-hole penetrating the substrate 84. The recessed portion 97 is closed by the first photosensitive layer 82. Thereafter, the first photosensitive layer 82 is bonded to the substrate 84 by the same method as that in the fifth embodiment.

Figure 9C:
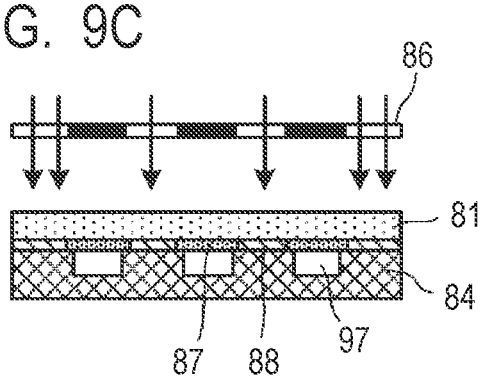
FIG. 9C is a diagram illustrating a manufacturing method for the structure according to the sixth embodiment.
Figure 9D:
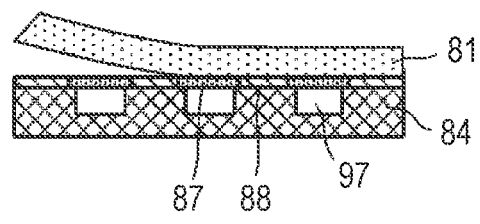
FIG. 9D is a diagram illustrating a manufacturing method for the structure according to the sixth embodiment.

Next, as illustrated in FIG. 9C, a first exposing step is performed. In the first exposing step, the first photosensitive layer 82 is irradiated with light in the direction of the arrow via the support 81 and a photomask 86 to perform an exposure treatment. As a result, the first photosensitive layer 82 is formed with an unexposed portion 87 in which light is shielded by a light-shielding portion of the photomask 86 and an exposed portion 88 irradiated with light. In the present embodiment, since a structure is formed in which the recessed portion 97 is covered or the recessed portion 97 is straddled by using the positive first photosensitive layer 82, the unexposed portion 87 is formed corresponding to the position directly above the recessed portion 97 and the position surrounding the recessed portion 97 on the substrate 84. The exposed portion 88 corresponds to the first region of the positive first photosensitive layer 82. The unexposed portion 87 corresponds to the second region of the first photosensitive layer 82 and is formed as a region that at least partially covers the recessed portion 97. In a case where a negative layer is used as the first photosensitive layer 82, the placement of the transmitting portion and the light-shielding portion in the photomask 86 is required to be reversed from that illustrated in FIG. 9C. Thereafter, as illustrated in FIG. 9D, the support 81 is peeled off from the first photosensitive layer 82 and the support 81 is removed from the substrate 84. The peeling off the support 81 from the first photosensitive layer 82 is performed in the same manner as that in the fifth embodiment.

Figure 9E:
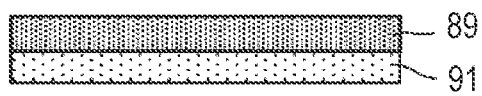
FIG. 9E is a diagram illustrating a manufacturing method for the structure according to the sixth embodiment.

Next, as illustrated in FIG. 9E, a second photosensitive layer 89 is formed on a support 91, which is the second support, separately from the steps illustrated in FIGS. 9A to 9D. As the support 91, the same one as the support 31 in the fifth embodiment can be used. Since the exposure is not performed through the support 91, the support 91 may be opaque to the exposure light. The second photosensitive layer 89 is not particularly limited as long as the second photosensitive layer 89 is a photosensitive layer and here, the same type of positive photoresist as that of the first photosensitive layer 82 is used. When the first photosensitive layer 82 is positive, the second photosensitive layer can also be positive and when the first photosensitive layer 82 is negative, the second photosensitive layer 89 can also be negative. The second photosensitive layer 89 can be photosensitive with light having the same wavelength as that of the first photosensitive layer 82 and has, for example, photosensitive with a wavelength of 365 nm. The sensitivity of the second photosensitive layer 89 can be the same as or lower than the sensitivity of the first photosensitive layer 82.

Figure 9F:
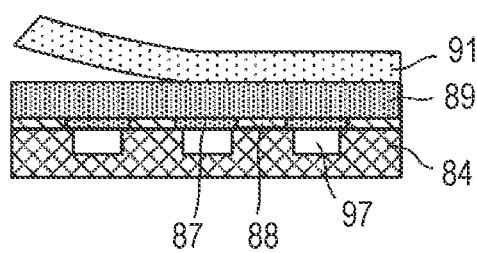
FIG. 9F is a diagram illustrating a manufacturing method for the structure according to the sixth embodiment.

Next, as illustrated in FIG. 9F, the second photosensitive layer 89 formed on the support 91 is turned upside down and the second photosensitive layer 89 is placed on the first photosensitive layer 82 formed on the substrate 84 so that the second photosensitive layer 89 is in contact with the first photosensitive layer 82. At this time, although the unexposed portion 87 and the exposed portion 88 are formed on the first photosensitive layer 82, the upper surface of the first photosensitive layer 82 is flat, so that the second photosensitive layer 89 can be stably placed on the first photosensitive layer 82. By applying pressure to the second photosensitive layer 89 under a temperature condition exceeding the softening point of the second photosensitive layer 89, the second photosensitive layer 89 is laminated and bonded to the first photosensitive layer 82. At that time, the temperature and pressure can be regulated according to the softening point of the material of the first photosensitive layer 82 so that the first photosensitive layer 82 formed on the substrate 84 does not soften too much. As described later, the support 91 can be peeled off from the second photosensitive layer 89 after the second photosensitive layer 89 is bonded to the first photosensitive layer 82.

Figure 9G:
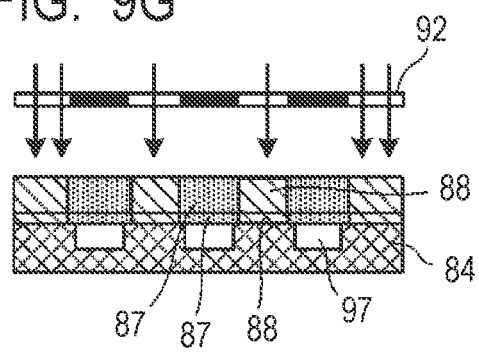
FIG. 9G is a diagram illustrating a manufacturing method for the structure according to the sixth embodiment.

Next, as illustrated in FIG. 9G, a second exposing step is performed. In the second exposing step, the second photosensitive layer 89 is exposed by being irradiated with light in the direction of the arrow via a photomask 92. At this time, the light transmitted via the photomask 92 reaches the first photosensitive layer 82 located below the second photosensitive layer 89, so that the first photosensitive layer 82 is also exposed to light. By exposing the first photosensitive layer 82 to light in the second exposing step, the exposure of the unexposed portion of the first photosensitive layer 82 due to the foreign matter existing on the support 81 during the first exposing step is complemented in the second exposing step. As a result, according to the present embodiment, it is possible to prevent the occurrence of a pattern defect in the first photosensitive layer 82 due to the foreign matter on the support 81. In addition, the second photosensitive layer 89 is the outermost layer in the structure of the present embodiment and when a foreign matter is present on the support 91 that supports the second photosensitive layer 89, the foreign matter may be an obstructive factor at the time of exposure and causes a pattern defect. Therefore, the support 91 can be peeled off from the second photosensitive layer 89 before starting the second exposing step. In addition, after the support 91 is peeled off, an additional exposure treatment may be performed via the photomask 86 used in the first exposing step before the second exposing step is performed. As the photomask 92 used in the second exposing step, the photomask 86 used in the first exposing step may be used as it is. Furthermore, after the exposure using the photomask 92 is performed as the second exposing step, the additional exposure treatment may be performed using the photomask 86 used in the first exposing step.

Figure 9H:
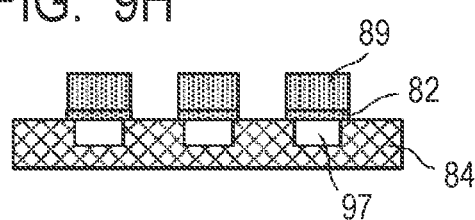
FIG. 9H is a diagram illustrating a manufacturing method for the structure according to the sixth embodiment.

Next, development is performed as illustrated in FIG. 9H. In the developing step, the exposed portion 88 of the first photosensitive layer 82 on the substrate 84 and the exposed portion 88 of the second photosensitive layer 89 are dissolved in the developing solution and simultaneously removed and a structure in which the first photosensitive layer 82 and the second photosensitive layer 89 are patterned on the recessed portion 97 of the substrate 84 is completed. After the developing step with the developing solution, a substrate cleaning treatment using a rinsing solution may be performed. Also in the present embodiment, even when exposure inhibition occurs in the first photosensitive layer 82 due to an exposure inhibitor such as a foreign matter on the support 81 during the first exposing step, since the portion where the exposure is hindered can be eliminated by the second exposing step, the occurrence of a pattern defect can be suppressed.

Manufacturing Example 5

Next, an example in which the structure is actually manufactured based on the sixth embodiment will be described. A silicon substrate was used as the substrate 84. As the first photosensitive layer 82, a positive photoresist containing silicon (Si) having etching resistance was used and a first photosensitive layer 82 having a thickness of 1 μm was formed on the support 81 in the same manner as that in the fifth embodiment. When the first photosensitive layer 82 was bonded to the substrate 84, the first photosensitive layer 82 was bonded to the substrate 84 by laminating under vacuum under the conditions of a temperature of 90° C., a pressure of 0.4 MPa and a pressurizing time of 60 seconds so that the thickness of the first photosensitive layer 82 was 1 μm. Next, a first exposing step was performed. In the first exposing step, a photomask 86 was used to irradiate the first photosensitive layer 82 with light having a wavelength of 365 nm at an exposure amount of 5000 J/m$^2$ via the support 81 to perform pattern exposure. Next, PEB was performed at a temperature of 50° C. for 5 minutes and thereafter the support 81 was peeled off from the first photosensitive layer 82.

As the second photosensitive layer 89, a positive photoresist having etching resistance was used and a positive photoresist having an etching resistance was formed on the support 91 in the same manner as that in the fifth embodiment to a thickness of 5 μm. Next, the second photosensitive layer 89 held by the support 91 was laminated on the first photosensitive layer 82 formed on the substrate 84 by using a laminating method under vacuum. At that time, the temperature and pressure were regulated according to the softening point of the material of the first photosensitive layer 82 so that the first photosensitive layer 82 formed on the substrate 84 did not soften too much. The second photosensitive layer 89 was bonded to the first photosensitive layer 82 under the conditions of a temperature of 70° C., a pressure of 0.4 MPa and a pressurizing time of 60 seconds. After the support 91 was peeled off, a second exposing step was performed under the same conditions as the first exposing step, then PEB was performed and then a developing step was performed. In the developing step, an alkaline aqueous solution containing approximately 2.3% by mass of TMAH was used as the developing solution. After development, the substrate 84 was washed with pure water as a rinsing solution to complete the structure.

Hereinbefore, the embodiments of the present disclosure is described. The manufacturing method for the structure based on the present disclosure can be used, for example, for manufacturing the liquid ejection head. The liquid ejection head manufactured in this manner can be mounted on a device such as a printer, a copier, a facsimile having a communication system and a word processor having a printer unit and an industrial recording device combined with various processing devices. By using the device equipped with this liquid ejection head, recording can be performed on various recorded objects such as paper, thread, fiber, leather, metal, plastic, glass, wood and ceramic. In particular, the liquid ejection head manufactured based on the present disclosure is suitable for an ink jet recording head using a water-based ink. Furthermore, the present disclosure can also be applied to a manufacturing method for a liquid ejection head that ejects a liquid other than ink, for example, a liquid ejection head used for applications such as biochip manufacturing and electronic circuit printing. Furthermore, the present disclosure can be applied to a manufacturing method for a structure by patterning a photoresist which is a photosensitive resin composition on one of a substrate having no through-holes and a substrate having through-holes.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-054241, filed Mar. 25, 2020, which is hereby incorporated by reference herein in its entirety.

What is claimed is:

1. A manufacturing method for a structure, comprising:
preparing a first photosensitive layer on one surface of a first support;
bonding the first photosensitive layer and one surface of a substrate so that the first photosensitive layer and the substrate are in contact with each other;
performing a first exposure of the first photosensitive layer bonded to the substrate via the first support;
removing the first support after the first exposure;
performing a second exposure of the first photosensitive layer after the first support is removed via a photomask; and
developing the first photosensitive layer after the first exposure and the second exposure,
wherein
the first photosensitive layer is made of a negative photosensitive resin and is divided into a first region removed by the developing and a second region left after the developing,
in the first exposure, at least the first region is exposed with an exposure amount less than a minimum exposure amount of the first photosensitive layer,
in the second exposure, the second region is exposed with an exposure amount equal to or more than the minimum exposure amount of the first photosensitive layer, and
in the first exposure, a predetermined region of the first photosensitive layer including the first region is shielded and exposure is performed.

2. A manufacturing method for a structure, comprising:
preparing a first photosensitive layer on one surface of a first support;
bonding the first photosensitive layer and one surface of a substrate so that the first photosensitive layer and the substrate are in contact with each other;
performing a first exposure of the first photosensitive layer bonded to the substrate via the first support;
removing the first support after the first exposure;
performing a second exposure of the first photosensitive layer after the first support is removed via a photomask; and developing the first photosensitive layer after the first exposure and the second exposure,
wherein
the first photosensitive layer is made of a negative photosensitive resin and is divided into a first region removed by the developing and a second region left after the developing,
in the first exposure, at least the first region is exposed with an exposure amount less than a minimum exposure amount of the first photosensitive layer,
in the second exposure, the second region is exposed with an exposure amount equal to or more than the minimum exposure amount of the first photosensitive layer, and in the first exposure, the first photosensitive layer is exposed via a first photomask,
the method further comprises
laminating a second photosensitive layer on the first photosensitive layer after removing the first support and before performing the second exposure,
in the second exposure, a second photomask is used as the photomask, the second photosensitive layer is pattern-exposed and the first photosensitive layer is also exposed via the second photosensitive layer, and
in the developing, the first photosensitive layer and the second photosensitive layer are simultaneously developed.

3. A manufacturing method for a structure, comprising:
preparing a first photosensitive layer on one surface of a first support;
bonding the first photosensitive layer and one surface of a substrate so that the first photosensitive layer and the substrate are in contact with each other;
performing a first exposure of the first photosensitive layer bonded to the substrate via the first support;
removing the first support after the first exposure;
performing a second exposure of the first photosensitive layer after the first support is removed via a photomask;
developing the first photosensitive layer after the first exposure and the second exposure; and
performing additional exposure using the first photomask after laminating the second photosensitive layer,
wherein
in the first exposure, an entire surface of the first photosensitive layer is exposed.

4. A manufacturing method for a structure, comprising:
preparing a first photosensitive layer on one surface of a first support;
bonding the first photosensitive layer and one surface of a substrate so that the first photosensitive layer and the substrate are in contact with each other;
performing a first exposure of the first photosensitive layer bonded to the substrate via the first support;
removing the first support after the first exposure;
performing a second exposure of the first photosensitive layer after the first support is removed via a photomask; and
developing the first photosensitive layer after the first exposure and the second exposure,
wherein
in the first exposure, an entire surface of the first photosensitive layer is exposed, and
in the first exposure, a predetermined region of the first photosensitive layer including the first region is shielded and exposure is performed.

5. The manufacturing method for a structure according to claim 1, wherein
in the first exposure, a predetermined region of the first photosensitive layer including a plurality of the first regions is shielded and exposed.

6. The manufacturing method for a structure according to claim 1, wherein
a gap between an end portion of the predetermined region of the first photosensitive layer in the first exposure and an end portion of a region where the first photosensitive layer is shielded in the second exposure is larger than an amount of deviation in alignment between the first exposure and the second exposure.

7. The manufacturing method for a structure according to claim 1, wherein
an opening is formed on the one surface of the substrate and the first region is a region including a formation region of the opening in the first photosensitive layer.

8. A manufacturing method for a structure, comprising:
preparing a first photosensitive layer on one surface of a first support;
bonding the first photosensitive layer and one surface of a substrate so that the first photosensitive layer and the substrate are in contact with each other;
performing a first exposure of the first photosensitive layer bonded to the substrate via the first support;
removing the first support after the first exposure;
performing a second exposure of the first photosensitive layer after the first support is removed via a photomask; and
developing the first photosensitive layer after the first exposure and the second exposure,
wherein
in the first exposure, an entire surface of the first photosensitive layer is exposed, and
in the first exposure, the first photosensitive layer is exposed via a first photomask,
the method further comprises
laminating a second photosensitive layer on the first photosensitive layer after removing the first support and before performing the second exposure,
in the second exposure, a second photomask is used as the photomask, the second photosensitive layer is pattern-exposed and the first photosensitive layer is also exposed via the second photosensitive layer, and
in the developing, the first photosensitive layer and the second photosensitive layer are simultaneously developed.

9. A manufacturing method for a structure, comprising:
preparing a first photosensitive layer on one surface of a first support;
bonding the first photosensitive layer and one surface of a substrate so that the first photosensitive layer and the substrate are in contact with each other;
performing a first exposure of the first photosensitive layer bonded to the substrate via the first support;
removing the first support after the first exposure;
performing a second exposure of the first photosensitive layer after the first support is removed via a photomask;
developing the first photosensitive layer after the first exposure and the second exposure; and
performing additional exposure using the first photomask after laminating the second photosensitive layer,
wherein
the first photosensitive layer is made of a negative photosensitive resin and is divided into a first region removed by the developing and a second region left after the developing, in the first exposure, at least the first region is exposed with an exposure amount less than a minimum exposure amount of the first photosensitive layer, and in the second exposure, the second region is exposed with an exposure amount equal to or more than the minimum exposure amount of the first photosensitive layer.

10. The manufacturing method for a structure according to claim 2, wherein light having the same wavelength is used in the first exposure and the second exposure and the first photosensitive layer has higher sensitivity than that of the second photosensitive layer at the wavelength.

11. The manufacturing method for a structure according to claim 2, wherein an opening is formed on the one surface of the substrate and the first region is a region including a formation region of the opening in the first photosensitive layer.

12. The manufacturing method for a structure according to claim 2, wherein a recessed portion is formed on the one surface of the substrate and the second region is a region at least partially covering the recessed portion in the first photosensitive layer.

13. The manufacturing method for a structure according to claim 1, wherein the first photosensitive layer is made of a positive photosensitive resin and is divided into a first region removed by the developing and a second region left after the developing, in the first exposure, at least the second region is exposed with an exposure amount less than a minimum exposure amount of the first photosensitive layer, and in the second exposure, the first region is exposed with an exposure amount equal to or more than the minimum exposure amount of the first photosensitive layer.

* * * * *